United States Patent [19]
Hornak et al.

[11] Patent Number: 5,678,222
[45] Date of Patent: Oct. 14, 1997

[54] MODULATION AND FREQUENCY CONVERSION BY TIME SHARING

[75] Inventors: Thomas Hornak, Portola Valley; Andrew Z. Grzegorek, San Jose; William J. McFarland, Redwood City; Richard C. Walker, Palo Alto; Scott D. Willingham, Half Moon Bay, all of Calif.

[73] Assignee: Hewlett-Packard Company, Palo Alto, Calif.

[21] Appl. No.: 321,501

[22] Filed: Oct. 12, 1994

[51] Int. Cl.⁶ .................................................. H04B 1/16
[52] U.S. Cl. ...................... 455/319; 455/302; 327/113; 327/175
[58] Field of Search ........................... 455/313, 344, 455/318, 208, 209, 302, 319; 327/113, 119, 124, 164, 172, 175; 329/306

[56] References Cited

U.S. PATENT DOCUMENTS

| | | | |
|---|---|---|---|
| 3,614,627 | 10/1971 | Runyan | 455/207 |
| 4,119,926 | 10/1978 | Frosch et al. | 331/1 A |
| 4,320,531 | 3/1982 | Dimon | 455/203 |
| 4,321,549 | 3/1982 | Hansen | 327/113 |
| 4,545,061 | 10/1985 | Hileman | 375/343 |

Primary Examiner—Edward F. Urban

[57] ABSTRACT

A time-share mixer circuit and a frequency converter, an I-Q modulator, and an I-Q demodulator. A switching signal drives the time-share mixer circuit to alternate between two output signals. The first output signal represents the output of a mixer having a given signal input and a local oscillator signal with a first phase as its local oscillator input. The second output signal represents the output of the mixer having the same input signal and the local oscillator signal with a second phase that differs from the first phase by 90 degrees as its local oscillator input signal. The frequency converter uses the time-share mixer in combination with a switched output phase shifter that switches in sync with the phase of the local oscillator signal to generate a phase shifted output signal in which the time average of an undesired image signal is substantially reduced compared to time average of the desired signal. The phase shifted output signal is then amplified by a bandpass amplifier. A clocked inverter in series with one of the mixer ports provides improved performance by eliminating the need for two precisely phase-shifted local oscillator signals.

29 Claims, 20 Drawing Sheets

MODULATION AND FREQUENCY CONVERSION BY TIME SHARING

FIELD OF THE INVENTION

The present invention relates generally to radio communications and more particularly to radio circuitry that uses a time-shared mixer and local oscillator to modulate, demodulate, and change the carrier frequency of an RF signal.

BACKGROUND OF THE INVENTION

A superheterodyne radio receiver converts the carrier frequency of an input signal to an intermediate frequency while maintaining the modulation (amplitude, phase or frequency modulation) of the input signal. The reason for doing this is that a radio receiver must be able to receive and amplify input signals over a range of carrier frequencies. However, more gain can be obtained from a fixed-frequency amplifier than from one that must amplify over a range of frequencies. Converting the carrier of the input signal to a fixed intermediate frequency allows the amplifier stages to operate on only one frequency, thereby providing more gain from each stage than would otherwise be obtainable. Each such amplifier stage is a bandpass amplifier that amplifies any signal having a frequency within a defined bandwidth centered on the intermediate frequency of the receiver; other signals are rejected.

An ordinary AM or FM receiver of the kind used in the home typically has only one intermediate frequency and a small number of intermediate-frequency ("IF") amplifier stages. However, receivers that operate in the microwave spectrum or beyond may have several IF amplifiers each of which operates at a different intermediate frequency. This is because the total gain required of such a receiver may be as high as $10^5$. Several high-gain amplifier stages must be used to obtain such high gain. Operating each stage at a different frequency reduces the danger of amplifier instability due to parasitic feedback from one stage to another.

From the foregoing it will be apparent that every superheterodyne receiver requires a frequency converter to convert the frequency of the input signal to the correct frequency for the IF amplifier. If the receiver has several IF amplifiers operating at different frequencies, then several frequency converters will be required, one for each different intermediate frequency used in the receiver.

A frequency converter has two elements: a local oscillator and a mixer. The local oscillator generates a signal having a frequency ($f_{LO}$) that differs from the frequency ($f_D$) of a desired input signal. The mixer combines the desired input signal with the local oscillator signal to produce two new signals, one having a frequency ($f_{SUM}$) equal to the sum of the desired input signal frequency and the local oscillator frequency:

$$f_{SUM} = f_D + f_{LO} \quad (1)$$

and one having a frequency ($f_{DIFF}$) equal to the difference between the desired input signal frequency and the local oscillator frequency:

$$f_{DIFF} = f_D - f_{LO} \quad (2)$$

Typically the user adjusts the frequency of the local oscillator below the desired input signal frequency such that, when the local oscillator signal is mixed with the desired input signal, the mixer produces a difference signal having a frequency equal to the IF amplifier frequency ($f_{IF}$). Substituting $f_{IF}$ for $f_{DIFF}$ and rearranging equation (2) results in the following:

$$f_D = f_{LO} + f_{IF} \quad (3)$$

If other signals are present at the receiver input, they too will be mixed with the local oscillator signal to produce sum and difference signals; in general, however, the frequencies of these sum and difference signals will not be the same as $f_{IF}$ and hence these sum and difference signals will be rejected by the IF amplifier. Thus, only an input signal having a frequency $f_D$ which is equal to the sum of the local oscillator frequency $f_{LO}$ and the intermediate frequency $f_{IF}$ will be converted to the correct intermediate frequency and amplified by the IF amplifier.

In a home radio receiver the local oscillator is tuned by means of the tuning control. Although the dial indicates the frequency of the desired station, the tuning control actually sets the local oscillator frequency to be equal to the difference between the desired frequency and the receiver IF. This is how the desired radio station is selected. In other kinds of receivers, other means may be used to tune the frequency of the local oscillator.

Although most input signals other than the desired one are rejected, one unwanted signal can get through. This is because, as noted above, the mixer produces both sum and difference frequencies. Just as equation (3) shows that an input signal having a frequency equal to the sum of $f_{LO}$ and $f_{IF}$ will be accepted by the IF amplifier, so equation (1) shows that an unwanted input signal having a frequency equal to the difference between $f_{LO}$ and $f_{IF}$ will also be converted to the receiver IF and will be accepted by the IF amplifier. This unwanted signal $f_U$ is referred to as the "image" signal:

$$f_U = f_{LO} - f_{IF} \quad (4)$$

Subtracting equation (4) from equation (3) shows that the difference between the desired and undesired frequencies is $2f_{IF}$. Most receivers are able to reject such image frequencies by means of a bandpass filter before the mixer. Such a filter prevents the undesired image frequency from entering the mixer. Thus, the mixer only processes the desired signal, since the amplitude of the undesired image signal will have been attenuated by the bandpass filter prior to reaching the mixer.

The input bandpass filter method of image rejection is adequate in receivers such as AM, FM and television receivers of the kind commonly found in the home. This method also gives satisfactory results in the second or further frequency converting stages of a receiver having multiple intermediate frequencies because the desired mixer input frequencies are fixed and are already relatively low. But in the first frequency converting circuit of a receiver tunable across a range of input frequencies in the microwave portion of the spectrum or beyond, the situation is different.

Consider a frequency converting circuit in a receiver designed to operate in a band of frequencies such as one of the industrial, scientific or medical frequency bands having a range of desired input frequencies between, say, 902 MHz and 928 MHz. It would be desirable to use a reasonably inexpensive fixed input bandpass filter to screen out the unwanted image signals. However, to separate a desired input signal having a frequency in this range from its undesired image signal by means of such a filter, there would have to be a guard band of at least 100 MHz between the two range limits. This would require an $f_{IF}$ of at least 63 MHz.

For a monolithic radio receiver (a receiver fabricated on a single integrated circuit substrate) it is advantageous to limit all intermediate frequencies to less than 10 MHz. This is because there are no practical ways to make IF amplifiers that operate at higher frequencies in a monolithic design. Inductor-capacitor-tuned IF amplifiers tunable to frequencies above 10 MHz are difficult to make because low-loss on-chip inductors are not available. The alternative to an inductor-capacitor-tuned IF amplifier would be an active filter. However, an active filter that works at frequencies above 10 MHz demands relatively large amounts of power; this makes it impractical to put both the filter and the rest of the receiver on a single chip. If the filter is located off the receiver chip, an extra port must be provided on the receiver chip to connect the receiver to the filter, and driving the extra parasitic capacitance that accompanies such a port takes still more power. Accordingly the only practical way to design monolithic receivers has been to limit the $f_{IF}$ of the receiver to not more than 10 MHz.

As discussed previously, a receiver intended to receive signals in the 900 MHz range needs an $f_{IF}$ of at least 63 MHz if image frequencies are to be rejected by means of an input bandpass filter. However, a practical receiver with an $f_{IF}$ of over 10 MHz cannot be fabricated on a single substrate. Thus, in order to fabricate a 900 MHz receiver on a single substrate, some other way of rejecting image frequencies must be found.

One kind of frequency converter that includes the capability of rejecting an image signal without using a fixed bandpass filter in front of the mixer is illustrated in FIG. 1. In this prior art system, two matched mixers 11 and 13 are driven in parallel by an input signal. A local oscillator 15 drives the first mixer 11 directly. The local oscillator drives the second mixer 13 through a first 90° phase shifter 17. The first mixer provides an output to a summing circuit 19. The second mixer provides an output to the summing circuit through a second 90° phase shifter 21. The output of the summing circuit becomes the input of an IF amplifier 23. The IF amplifier is tuned to the intermediate frequency $f_{IF}$ of the receiver.

The first mixer passes both the desired signal and the undesired image signal, shifted in frequency from their respective carrier frequencies $f_D$ and $f_U$ to $f_{IF}$, to the summing circuit. The second mixer does likewise; however, the two phase shifters have the effect of introducing a 180° phase shift into the frequency-converted image signal provided by the second mixer, whereas the phase of the frequency-converted desired signal is unaffected. In the summing circuit, the image signal from the first mixer and the 180° phase-shifted image signal from the second mixer cancel each other. Thus, only the desired signal is passed from the summing circuit to the IF amplifier.

The action of the two mixers and the two phase shifters will now be explained in more detail. The desired input signal D(t) may be expressed in the form:

$$D(t)=D \sin (\omega_D t+\phi_D) \qquad (5)$$

where D is the amplitude of the desired input signal, $\omega_D$ is the angular frequency, and $\phi_D$ is the phase. Applying the definition $\omega=2\pi f$ to equation (3) above results in $$\omega_D=\omega_{LO}+\omega_{IF} \qquad (6)$$

and substituting (6) into (5) yields the following expression for the desired input signal:

$$D(t)=D \sin ((\omega_{LO}+\omega_{IF})t+\phi_D) \qquad (7)$$

By similar reasoning the unwanted image signal U(t) may be expressed in the form $$U(t)=U \sin ((\omega_{LO}-\omega_{IF})t+\phi_U) \qquad (8)$$

The phase angles $\phi_D$ and $\phi_U$ are arbitrary and will be disregarded in the rest of this discussion.

The first mixer 11 combines the desired input signal with the local oscillator signal, which may be expressed as $\cos(\omega_{LO}t)$, resulting in the following component in the mixer output signal:

$$D \sin \{\omega_{LO}+\omega_{IF})t\} \cos (\omega_{LO}t) \qquad (9)$$

Applying the trigonometric identity $\sin x \cos y=\frac{1}{2}(\sin(x+y)+\sin(x-y))$ to expression (9) yields the following:

$$\frac{1}{2}D(\sin (2\omega_{LO}+\omega_{IF})t+\sin \omega_{IF}t) \qquad (10)$$

The first term of expression (10) has a frequency $(2\omega_{LO}+\omega_{IF})$, a frequency that will be attenuated and ignored by the IF amplifier. Thus, the second term of expression (10) is the only component of the desired signal, after mixing in the first mixer, that will be amplified by the IF amplifier. This second term is expressed as follows:

$$\frac{1}{2}D \sin \omega_{IF}t \qquad (11)$$

By similar reasoning, the only component of the image signal, after mixing in the first mixer, that will be amplified by the bandpass amplifier is:

$$-\frac{1}{2}U \sin \omega_{IF}t \qquad (12)$$

The second mixer 13 combines the desired input signal with the phase-shifted local oscillator signal. The phase-shifted local oscillator signal is expressed as $\sin(\omega_{LO}t)$. Reasoning as before, the desired input signal after mixing in the second mixer has only one component that will be accepted by the IF amplifier:

$$\frac{1}{2}D \cos \omega_{IF}t \qquad (13)$$

which leads expression (11) by 90°. The image signal, after mixing in the second mixer, has only one component that will be accepted by the IF amplifier:

$$\frac{1}{2}U \cos \omega_{IF}t \qquad (14)$$

which lags expression (12) by 90°. The second phase shifter 18 delays the phase of both expressions (11) and (12) by 90°, resulting in:

$$\frac{1}{2}D \sin \omega_{IF}t \qquad (15)$$

for the remaining component of the desired signal and $$\frac{1}{2}U \sin \omega_{IF}t \qquad (16)$$

for the remaining component of the image signal. When expressions (11), (12), (15) and (16) are added together in the summing circuit, the sum is $$D \sin \omega_{IF}t \qquad (17)$$

It will be apparent that the amplitudes of the undesired image components in the outputs of the mixers 11 and 13, set forth above as expressions (12) and (16) respectively, must exactly match if the undesired image signal is to be completely eliminated. This requirement is especially critical in mobile applications of a monolithic receiver because the power of an undesired image signal at the receiver antenna may be as much as 60 dB larger than that of a desired signal due to the so-called "near-far" effect. Rejecting an image by more than 60 dB (suppressing it—even in the worst case—below the desired signal) requires the difference between the gains of the two mixers to be less than 0.1% and any phase error between the mixers to be less than one milliradian. These tolerances are not achievable in a practical monolithic receiver. State-of-the-art image-rejecting frequency-converting circuits of the kind shown in FIG. 1 have not been capable of attenuating unwanted image signals by more than 20 dB in spite of the superior component matching achievable in integrated circuits.

Attempts to build practical I-Q modulation and demodulation circuits operable at frequencies at or above the 900 MHz range have encountered similar difficulties. Consider an I-Q modulation circuit as shown in FIG. 2. This circuit modulates a single carrier signal with two different signals $f_1(t)$ and $f_2(t)$. The first signal $f_1(t)$ is applied to a signal input of a first mixer 25 and the second signal $f_2(t)$ is applied to a signal input of a second mixer 27. A local oscillator 29 provides a carrier signal at the desired carrier frequency $F_D$; this signal is expressed as $\cos\omega_D t$ and is applied to the first mixer which combines its two input signals to provide a signal expressed as $f_1(t)\cos\omega_D t$. The oscillator signal is also applied to a 90° phase shifter 31. The output of the phase shifter, which is expressed as $\sin\omega_D t$, is applied to the second mixer which in turn provides an output expressed as $f_2(t)\sin\omega_D t$. These two mixer output signals are combined in a summer 33 to provide a final output signal F(t) expressed as:

$$F(t)=f_1(t)\cos\omega_D t + f_2(t)\sin\omega_D t \quad (18)$$

An I-Q demodulator is shown in FIG. 3. A signal such as the signal F(t) of equation (18) is applied to the inputs of two mixers 35 and 37. A local oscillator 39 provides a signal at the carrier frequency $F_D$. This signal, which as before is expressed as $\cos\omega_D t$, is applied to the first mixer 35 which in turn provides an output expressed as:

$$F(t)\cos\omega_D t = f_1(t)\cos^2\omega_D t + f_2(t)\cos\omega_D t \sin\omega_D t \quad (19)$$

Equation (19) by the application of trigonometric identifies becomes:

$$F(t)\cos\omega_D t = \tfrac{1}{2}f_1(t) + \tfrac{1}{2}f_1(t)\cos 2\omega_D t + \tfrac{1}{2}f_2(t)\sin 2\omega_D t \quad (20)$$

This output is applied to a low-pass filter 41 which attenuates the 2ω terms. Thus, the filter output is $\tfrac{1}{2}f_1(t)$, which after amplification is simply the original first signal $f_1(t)$.

The oscillator signal is also applied to a 90° phase shifter 43 which provides a signal that is expressed as $\sin\omega_D t$. This signal is applied to the second mixer 37 which in turn provides an output expressed as:

$$F(t)\sin\omega_D t = f_2(t)\sin^2\omega_D t + f_1(t)\cos\omega_D t \sin\omega_D t \quad (21)$$

Equation (19) by the application of trigonometric identities becomes:

$$F(t)\sin\omega_D t = \tfrac{1}{2}f_2(t) - \tfrac{1}{2}f_2(t)\sin 2\omega_D t - \tfrac{1}{2}f_1(t)\cos 2\omega_D t \quad (22)$$

This output is applied to a low-pass filter 45 which, similarly to the filter 43, attenuates the 2ω terms. Thus, the output of the filter 45 is $\tfrac{1}{2}f_2(t)$, which after amplification is simply the original second signal $f_2(t)$.

From this description it will be apparent that the phase shifters 31 (in the modulator) and 43 (in the demodulator) must shift the phase of their respective oscillator signals by exactly 90° to avoid inadvertently mixing up the two signals $f_1(t)$ and $f_2(t)$. It is also necessary that the modulator mixers 25 and 27 be precisely matched and that the demodulator mixers 35 and 37 be precisely matched. In the 900 MHz range, these constraints are difficult to satisfy.

Accordingly, it will be apparent that there is a need for a practical, realizable monolithic frequency conversion circuit that can receive a desired signal, especially at or above the 900 MHz range, and reject an image signal that is as much as 60 dB more powerful than the desired signal. There is also a need for I-Q modulator and demodulator circuits that can give good performance at similar frequencies.

SUMMARY OF THE INVENTION

The present invention provides a time-share mixer circuit that eliminates the need for precisely matched mixers in frequency conversion and I-Q modulation circuitry at any frequency up to the 900 MHz range and beyond. A frequency converter embodying the principles of the invention rejects an image signal as much as 60 dB more powerful than a desired signal.

Briefly and in general terms, a time-share mixer circuit according to the invention includes a mixer with primary and oscillator input ports, a local oscillator that provides an initial oscillator signal, a switching signal source, and alternating signal means driven by the switching signal. The alternating signal means controls the circuit in such a way that the output alternates back and forth between an in-phase output signal and a quadrature-phase output signal. The in-phase output signal is the same as that output signal which the mixer would provide in response to a given input signal if the initial oscillator signal were applied to the oscillator input port. The quadrature-phase output signal is the same as that output signal which the mixer would provide if the initial oscillator signal were phase-shifted by 90° and then applied to the oscillator input port.

In a first embodiment, the input signal is applied directly to the primary input port of the mixer and the time-share output signal is provided directly at the mixer output port. In this embodiment the alternating signal means consists of a phase shifter that shifts the phase of the initial oscillator signal by 90° and a switching element that alternately couples the initial oscillator signal and the phase-shifted oscillator signal to the oscillator port of the mixer.

In other embodiments, the alternating signal means consists of a clocked inverter in series with one of the ports of the mixer. In one such embodiment the clocked inverter is in series with the oscillator port of the mixer, the primary input port receives the input signal, and the output port provides the output signal. In another embodiment the clocked inverter is connected in series with the mixer output port, and in yet another embodiment the input signal is applied to the primary input port through the clocked inverter. In all of these embodiments, the clocked inverter is switched at a rate one-half the switching rate of the switching element in the first embodiment.

A time-share mixer as described above provides an output signal that switches back and forth at a rapid rate between the in-phase and quadrature phase outputs. In some applications it is desirable to equalize the duty cycles of these two outputs. A duty-cycle equalizer that switches at an even multiple of the rate of the switching signal alternately enables the in-phase and quadrature phase outputs for equal periods of time.

An I-Q modulator embodying the principles of the invention includes a time-share mixer and an I-Q switching element. The I-Q switching element, which is driven by the switching signal, alternately couples first and second information signals to the input of the time-share mixer. The output of the time-share mixer is bandpass filtered to provide an I-Q output signal modulated with both information signals.

An I-Q demodulator according to the invention also includes an I-Q switching element and a time-share mixer. The I-Q switching element, which as in the case of the modulator is driven by the switching signal, alternately connects the output of the time-share mixer to first and second low-pass filters. These filters in turn provide the demodulated first and second signals.

A time-share mixer in combination with an output phase shifter provides a frequency converter that shifts the carrier frequency of a desired RF signal while rejecting unwanted image signals. The output phase shifter, responsive to the switching signal, alternately shifts the phase of the time-share output signal by first and second phase shifts, the second phase shift differing from the first by 90 degrees. The output phase shifter is followed by a filter which provides the desired frequency-shifted signal.

In one embodiment the output phase shifter is a resistor-capacitor ("RC") filter with two switchable capacitors of different values. Switching back and forth between the two capacitors provides the two different phase shifts. In another embodiment the output of the time-share mixer is passed through a plurality of cascaded low-pass RC filters, a sample-and-hold circuit, an analog-to-digital converter, and a digital phase shifter responsive to a switching signal to provide the two different phase shifts. Still another embodiment uses a second time-share mixer as the phase shifter.

Other aspects and advantages of the invention will become apparent from the following detailed description, taken in conjunction with the accompanying drawings, illustrating by way of example the principles of the invention.

DETAILED DESCRIPTION OF THE INVENTION

Figure 1:
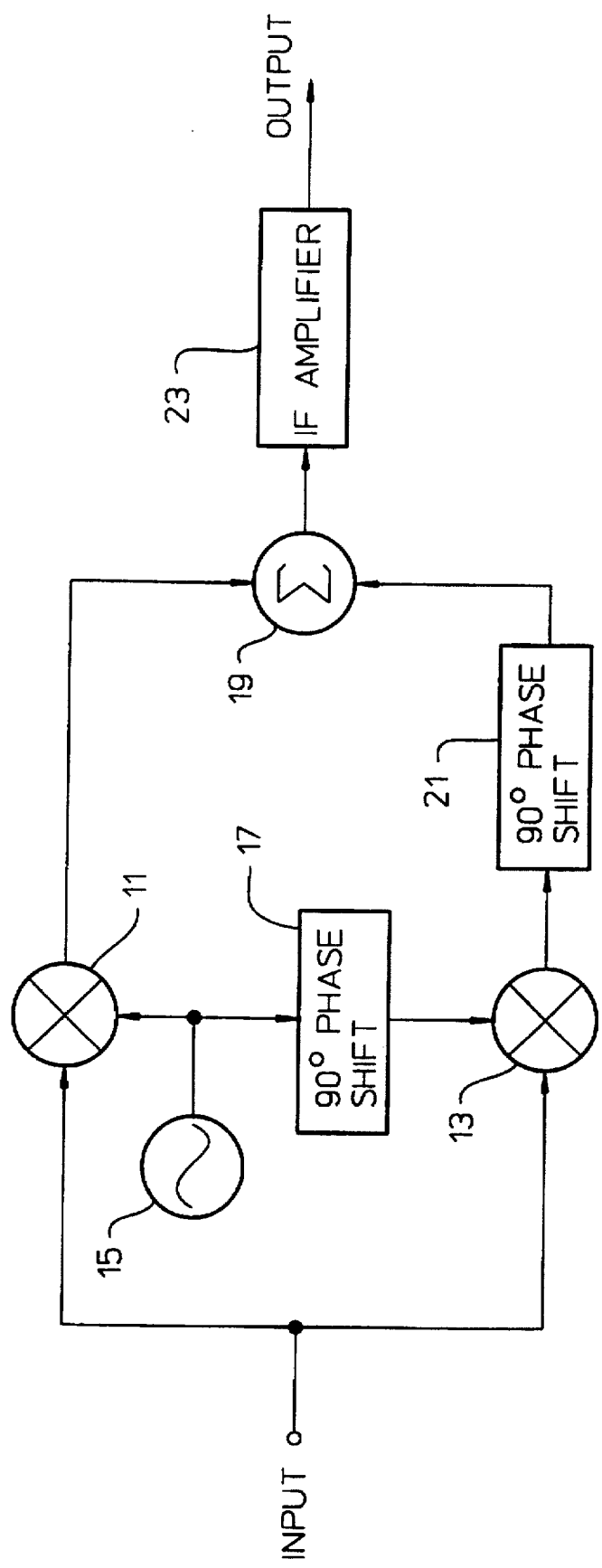
FIG. 1 is a block diagram of a frequency conversion circuit of a superheterodyne receiver according to the prior art.
Figure 2:
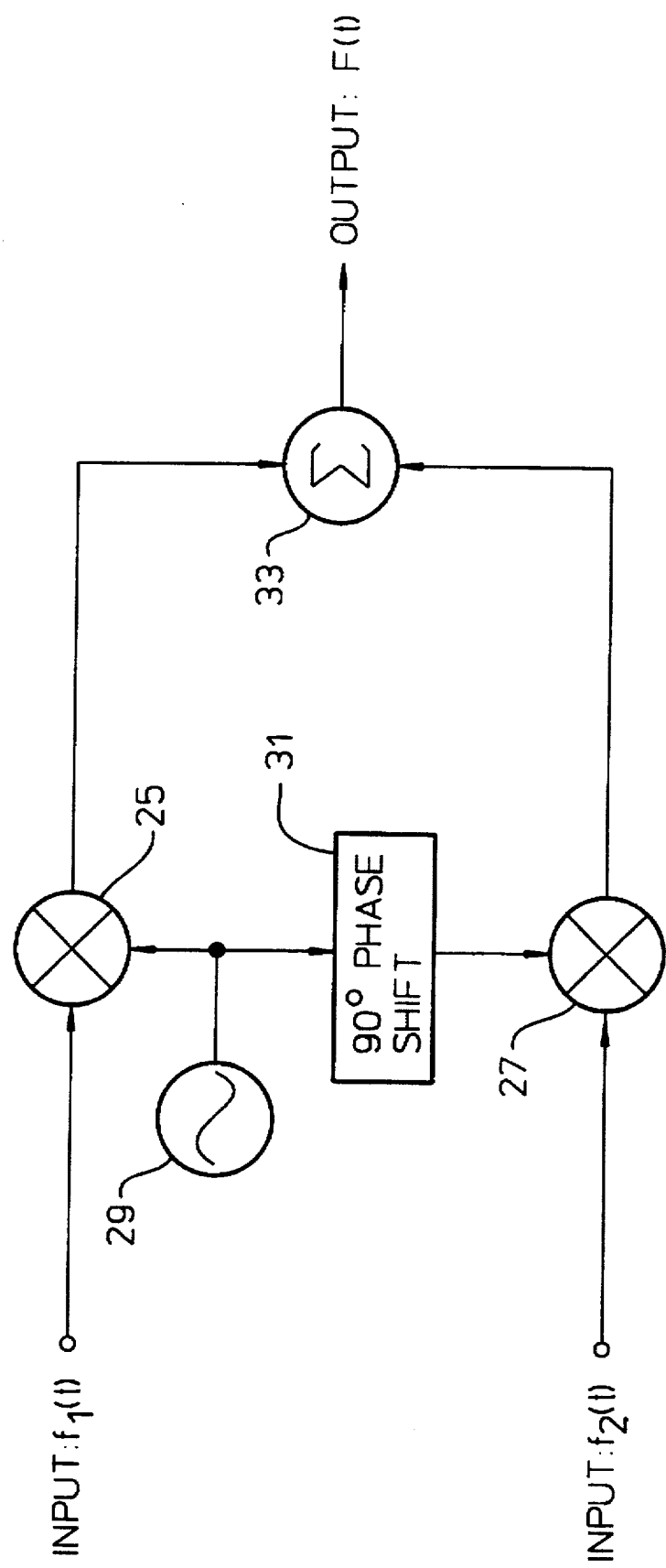
FIG. 2 is a block diagram of an I-Q modulator according to the prior art.
Figure 3:
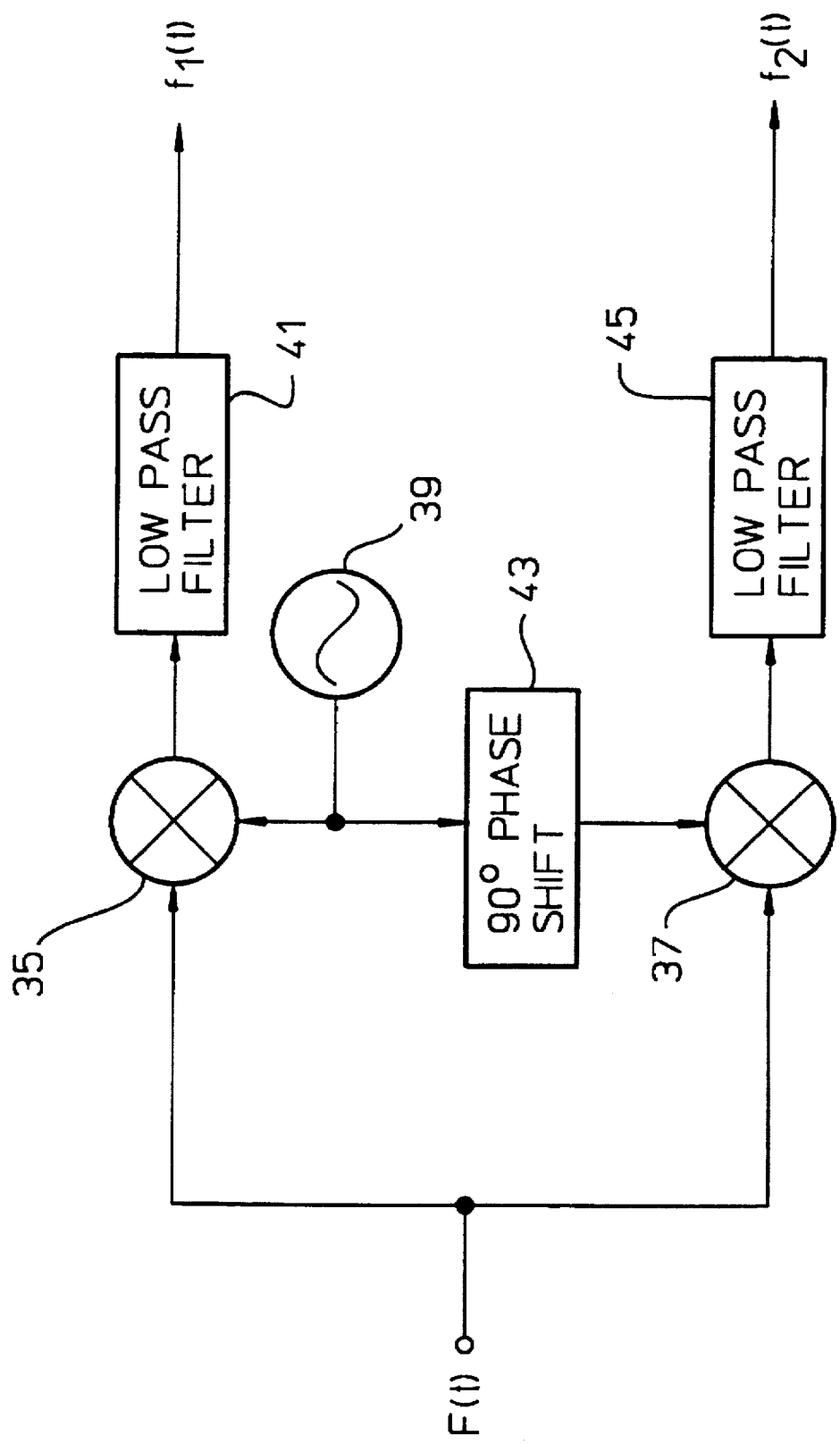
FIG. 3 is a block diagram of an I-Q demodulator according to the prior art.

As shown in the drawings for purposes of illustration, the invention is embodied in a novel time-share mixer circuit that forms the heart of a frequency converter, an I-Q modulator and an I-Q demodulator. Them has been a need for a 900 MHz-band monolithic frequency converter that can reject an image signal that is as much as 60 dB more powerful than a desired signal. There has also been a need for economical monolithic I-Q modulators and demodulators operable in the same frequency band.

A time-share mixer circuit according to the invention includes a mixer, a local oscillator, a switching signal source, and alternating signal means driven by the switching signal. The alternating signal means controls the circuit in such a way that the output alternates rapidly back and forth between an in-phase output signal and a quadrature-phase output signal. In one embodiment the alternating signal means consists of a 90° phase shifter that shifts the phase of the local oscillator signal and a switching element that alternately couples the original and phase-shifted oscillator signals to the mixer. In other embodiments the alternating signal means consists of a clocked inverter in series with one of the ports of the mixer.

A frequency converter according to the invention includes a time-share mixer in combination with an output phase shifter that alternately shifts the phase of the time-share output signal by 90°. An I-Q modulator according to the invention includes a time-share mixer and an I-Q switching element that alternately couples first and second information signals to the mixer input. Similarly, an I-Q demodulator includes an I-Q switching element and a time-share mixer; the switching element alternately connects the output of the time-share mixer to first and second low-pass filters which in turn provide the demodulated first and second signals.

Circuits embodying the invention are readily adaptable to monolithic construction. The time-share mixer eliminates any need for precisely-matched mixers and amplifiers. The use of a clocked inverter eliminates the need to precisely shift the phase of the local oscillator signal. A frequency converter that embodies the invention can reject an unwanted image signal that is as much as 60 dB stronger than a desired signal.

Figure 4:
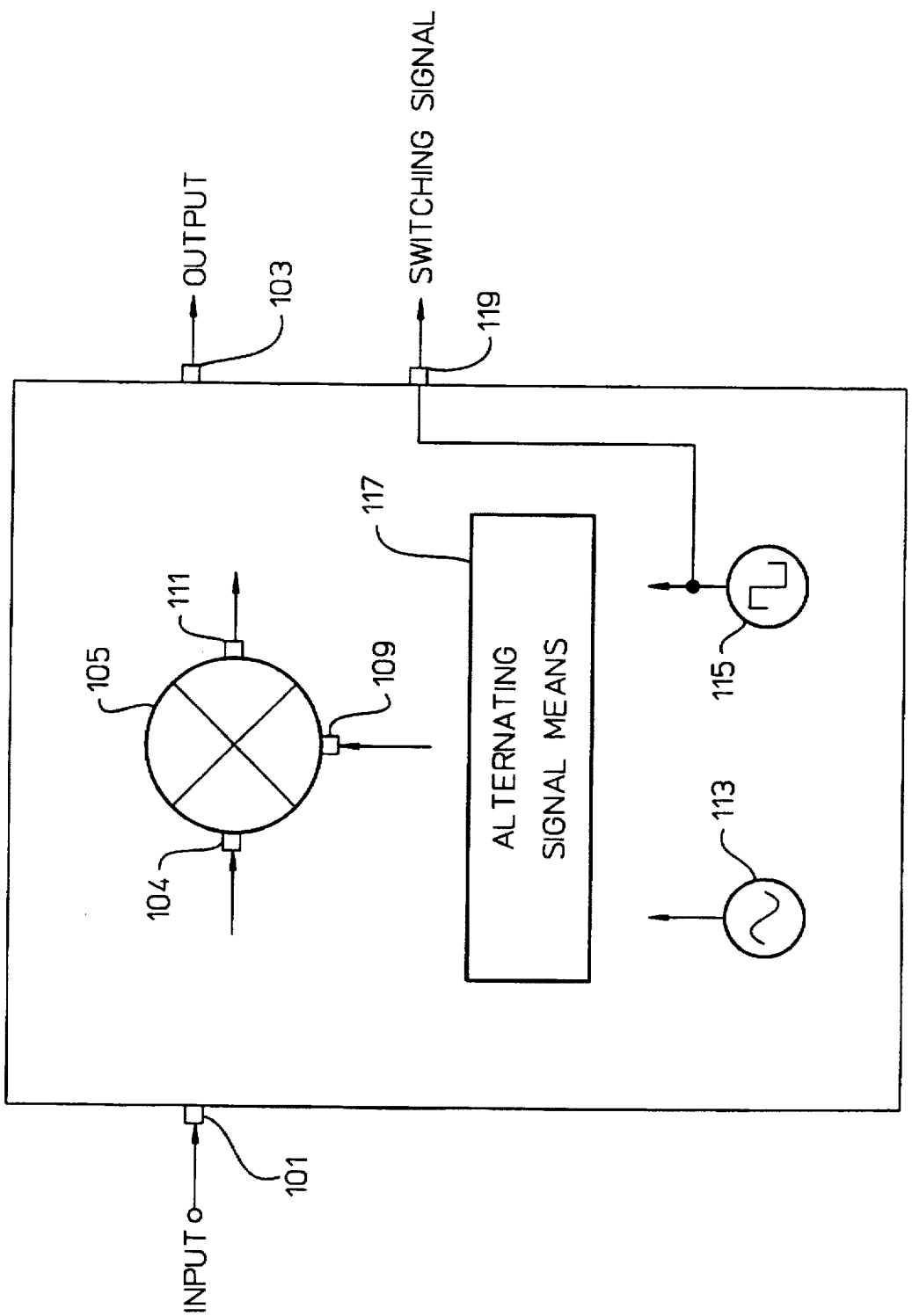
FIG. 4 is a conceptual diagram of a time-share mixer circuit according to the invention.

Turning now to the drawings, a time-share mixer circuit embodying the invention is shown conceptually in FIG. 4. The circuit receives an input signal at an input port 101 and provides a time-share output signal at an output port 103. The circuit includes a mixer 105 having a primary input port 107, an oscillator input port 109, and an output port 111. A local oscillator 113 provides an initial oscillator signal. A switching signal source 115 provides a switching signal. An alternating signal means 117 is responsive to the switching signal to cause the time-share output signal to alternate between an in-phase output signal and a quadrature-phase output signal. The in-phase output signal is that output signal which the mixer would provide if the input signal were applied to the primary input port and the initial oscillator signal were applied to the oscillator input port. The quadrature-phase output signal is that output signal which the mixer would provide if the input signal were provided to the primary input port and the initial oscillator signal were phase-shifted by 90° and then applied to the oscillator input The switching signal is also used by external components, as will be described presently, and is provided for this purpose at a switch signal output port 119.

Figure 5A:
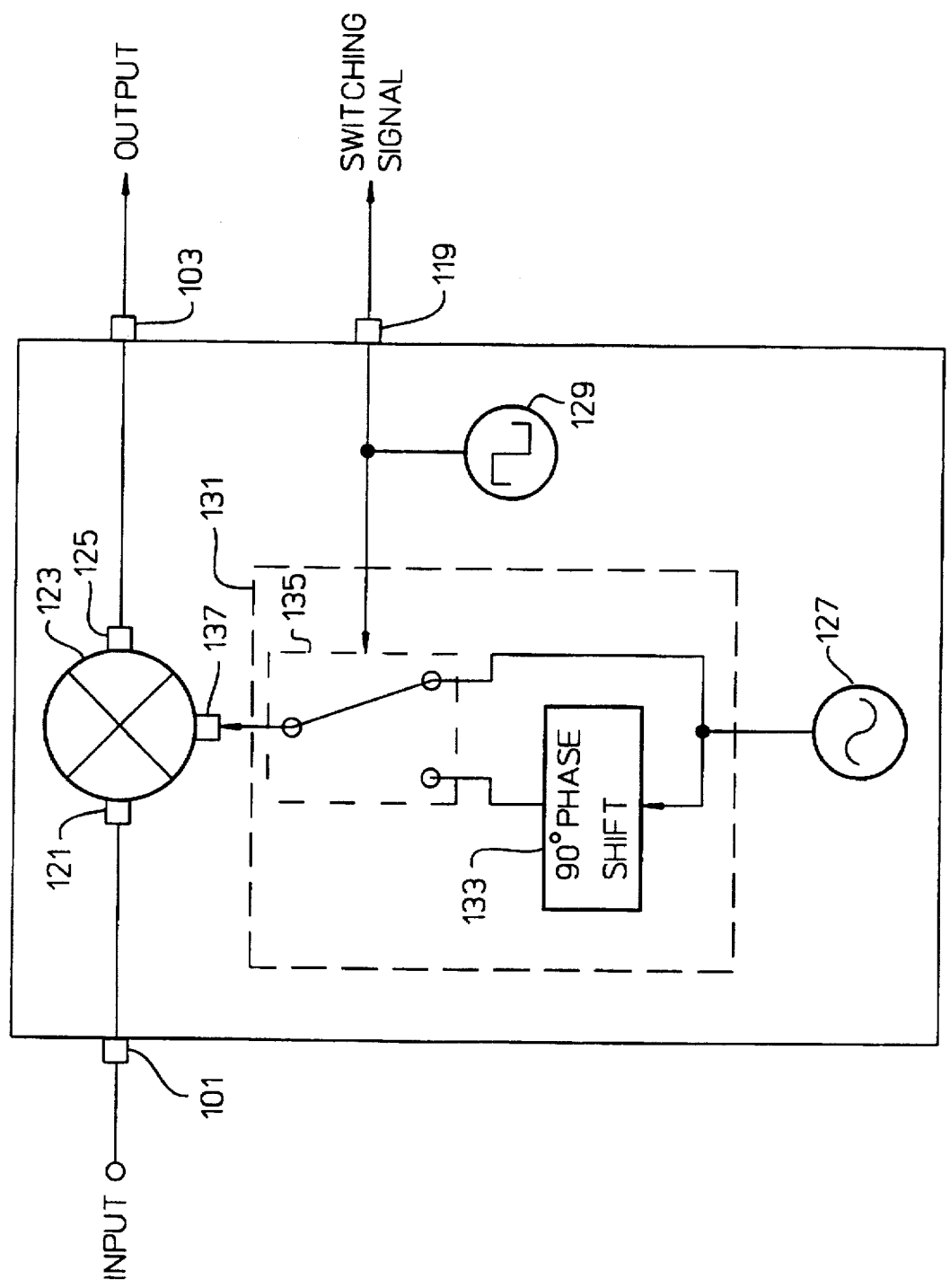
FIG. 5A is a block diagram of a time-share mixer circuit that includes a local oscillator phase shifter according to a first embodiment of the present invention.

FIG. 5A illustrates a particular embodiment of a time-share mixer circuit as conceptually described above. In this embodiment the input signal at the input port 101 is applied to a primary input port 121 of a mixer 123. The time-share output signal at the output port 103 is provided by an output port 125 of the mixer 123. A local oscillator 127 provides an initial oscillator signal. A switching signal source 129 provides a switching signal. An alternating signal means 131 is realized as a phase shifter 133 and a switching element 135. The phase shifter 133 shifts the phase of the initial oscillator signal by 90° to provide a phase-shifted oscillator signal. The switching element 135 is responsive to the switching signal to alternately couple the initial oscillator signal and the phase-shifted oscillator signal to an oscillator port 137 of the mixer 123.

The switching element 135 is shown for illustrative purposes as a mechanical switch contact. However, it will be apparent that a switching transistor or some other electronic switching element of a kind known to those skilled in the art would normally be used rather than a mechanical switch in this and the other embodiments described herein.

The phase shifter 133 is shown as a separate element from the local oscillator 127. Actually there may be two phase shifters, for example one that introduces a phase shift of +45° and one that introduces a phase shift of −45°, so long as the net effect is to provide two local oscillator signals having a phase difference of 90° between them. The phase shifter and oscillator may be combined in a single quadrature oscillator circuit that provides two signals of the same frequency but with a phase difference of 90°.

The difference between the phases of the two local oscillator signals must be precisely controlled. In some applications this phase difference must be controlled to within one milliradian at a local oscillator frequency in the range of 1 GHz. However, this requirement can be avoided by using a clocked inverter as the alternating signal means. This eliminates the need for two local oscillator signals. The clocked inverter, which is connected in series with one of the mixer ports, is similar to a synchronous rectifier of the kind that either inverts or does not invert an input signal as ordered by a clocking signal. In a synchronous rectifier the clocking signal is of the same phase and frequency as the input signal, resulting in an output that is a succession of half-cycles all of the same polarity. The output has a DC component, which is why the device is called a "rectifier". In contrast, in a clocked inverter as used in the present invention, the clocking signal is not of the same phase and frequency as the input signal and hence there is no DC component in the output.

Figure 5B:
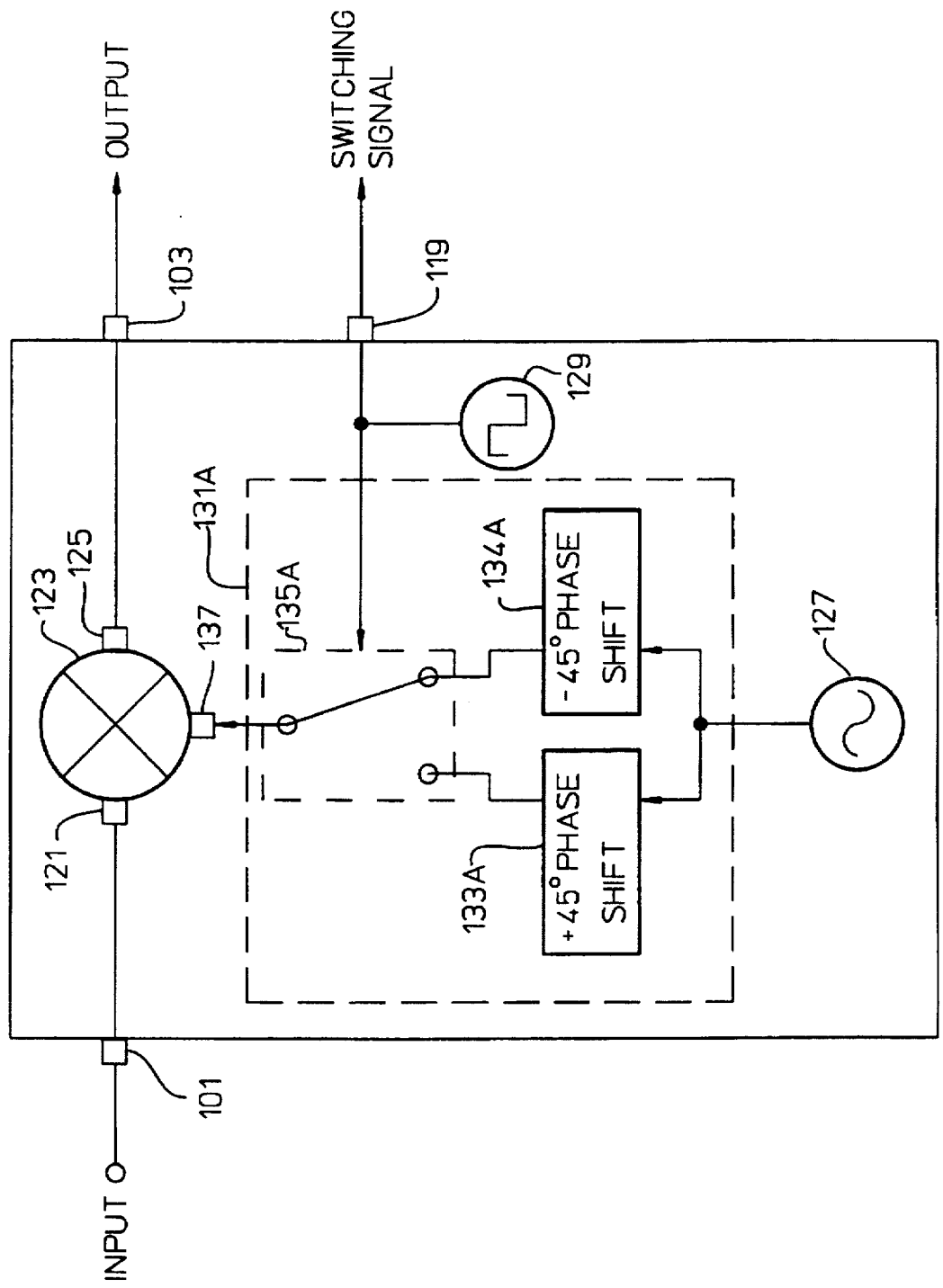
FIG. 5B is similar to FIG. 5A except that two phase shifters are used to generate the initial and phase-shifted local oscillator signals.

Of course, the initial oscillator signal may be generated by phase-shifting the local oscillator output by a first phase shift, for example, +45°, and the phase-shifted initial oscillator signal may be generated by phase-shifting the local oscillator output by a second phase shift, for example −45°. There must be a net 90° phase difference between the two signals as alternately applied to the oscillator input port. This is illustrated in FIG. 5B. FIG. 5B is similar to FIG. 5A except that the alternating signal means 131 has been replaced by a slightly different alternating signal means 131A. The means 131A includes two phase shifters 133A and 134A, each of which receives the initial oscillator signal from the local oscillator 127. The shifter 133A shifts the phase by a first amount, for example +45°, and the shifter 134A shifts the phase by a second amount, for example −45°; the amounts of these phase shifts are not critical so long as the difference between them is 90°. A switching element 135A alternates between the two phase-shifted local oscillator signals as driven by the switching signal from the signal source 129.

Figure 6:
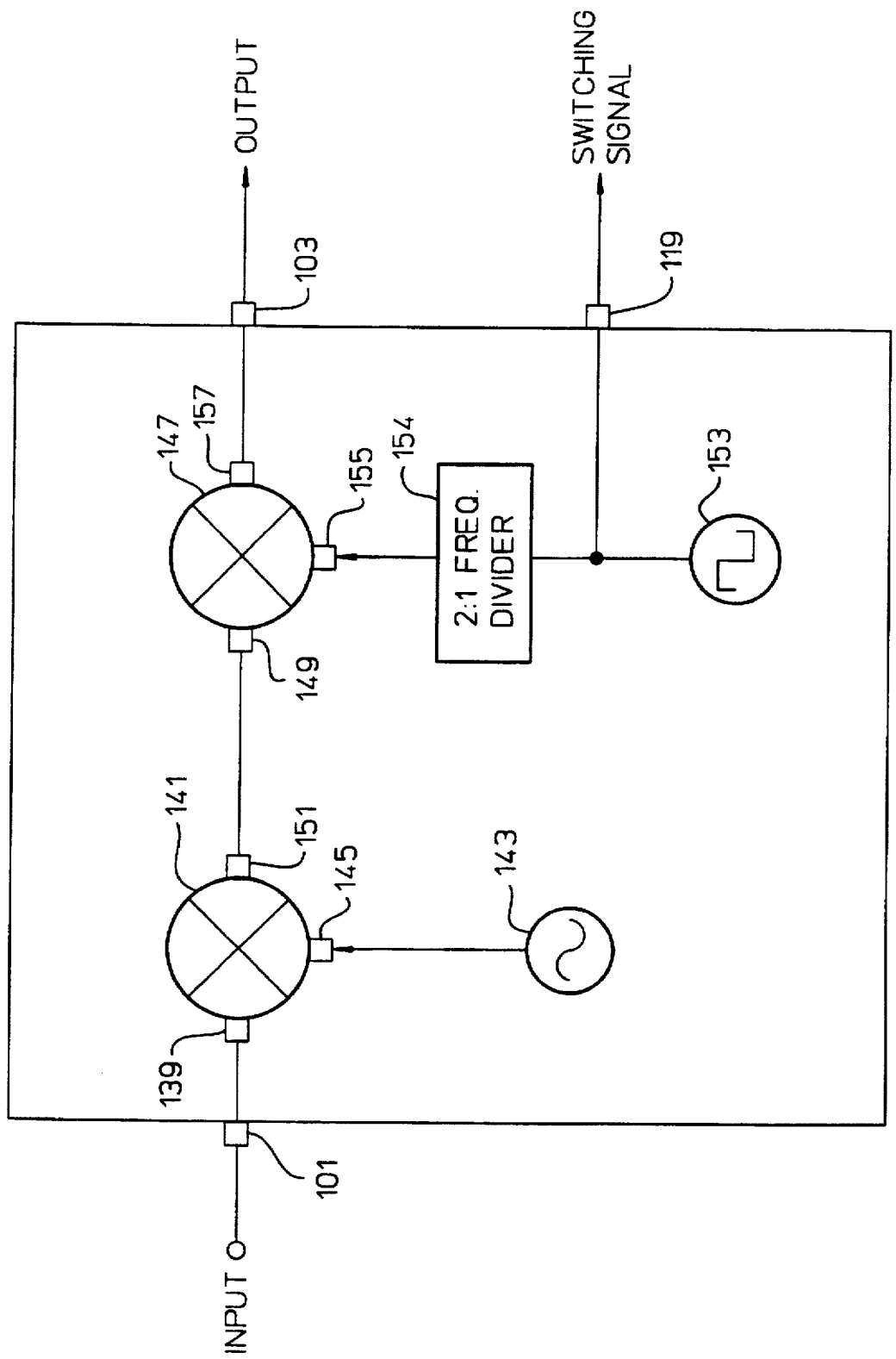
FIG. 6 is a block diagram of a time-share mixer circuit that includes a clocked inverter in series with the output port of the mixer according to a second embodiment of the invention.

One embodiment of a time-share mixer that uses a clocked inverter is shown in FIG. 6. An input signal is applied to a primary input port 139 of a mixer 141. An initial oscillator signal provided by an oscillator 143 is applied to an oscillator input port 145 of the mixer 141. A clocked inverter 147 has an input port 149 connected to an output port 151 of the mixer 141. A switching signal source 153 provides a switching signal to the clocked inverter 147 through a 2:1 frequency divider 154 and an input port 155. A time-share output signal is provided at an output port 157 of the clocked inverter. As will be explained in more detail presently, the frequency of the local oscillator in this embodiment differs from the frequency $f_{LO}$ of the local oscillator in the embodiment of FIG. 5A by one-half the switching frequency $f_C$.

Figure 7:
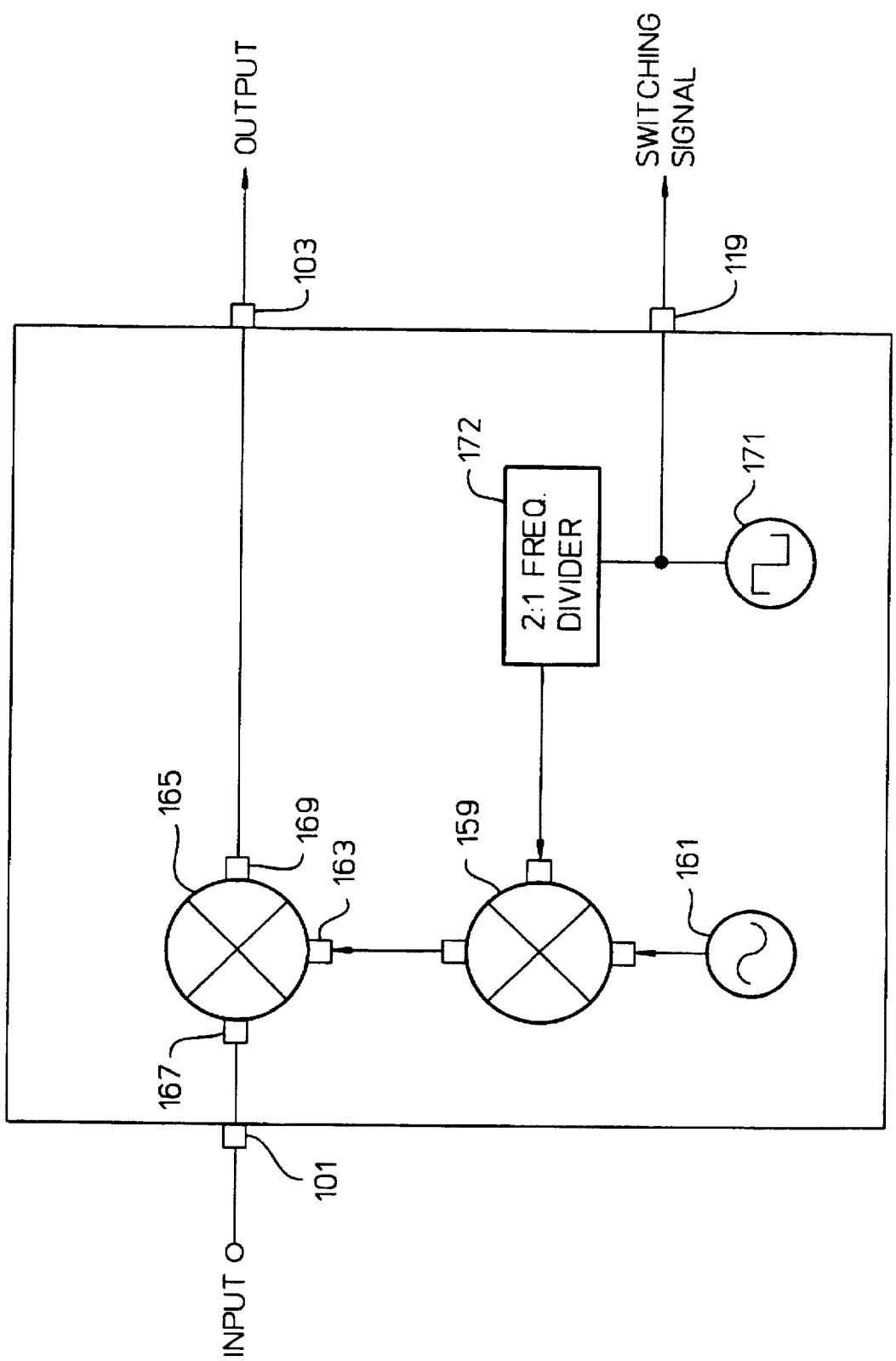
FIG. 7 is a block diagram of a time-share mixer circuit that includes a clocked inverter in series with the oscillator input port of the mix third embodiment of the invention.
Figure 8:
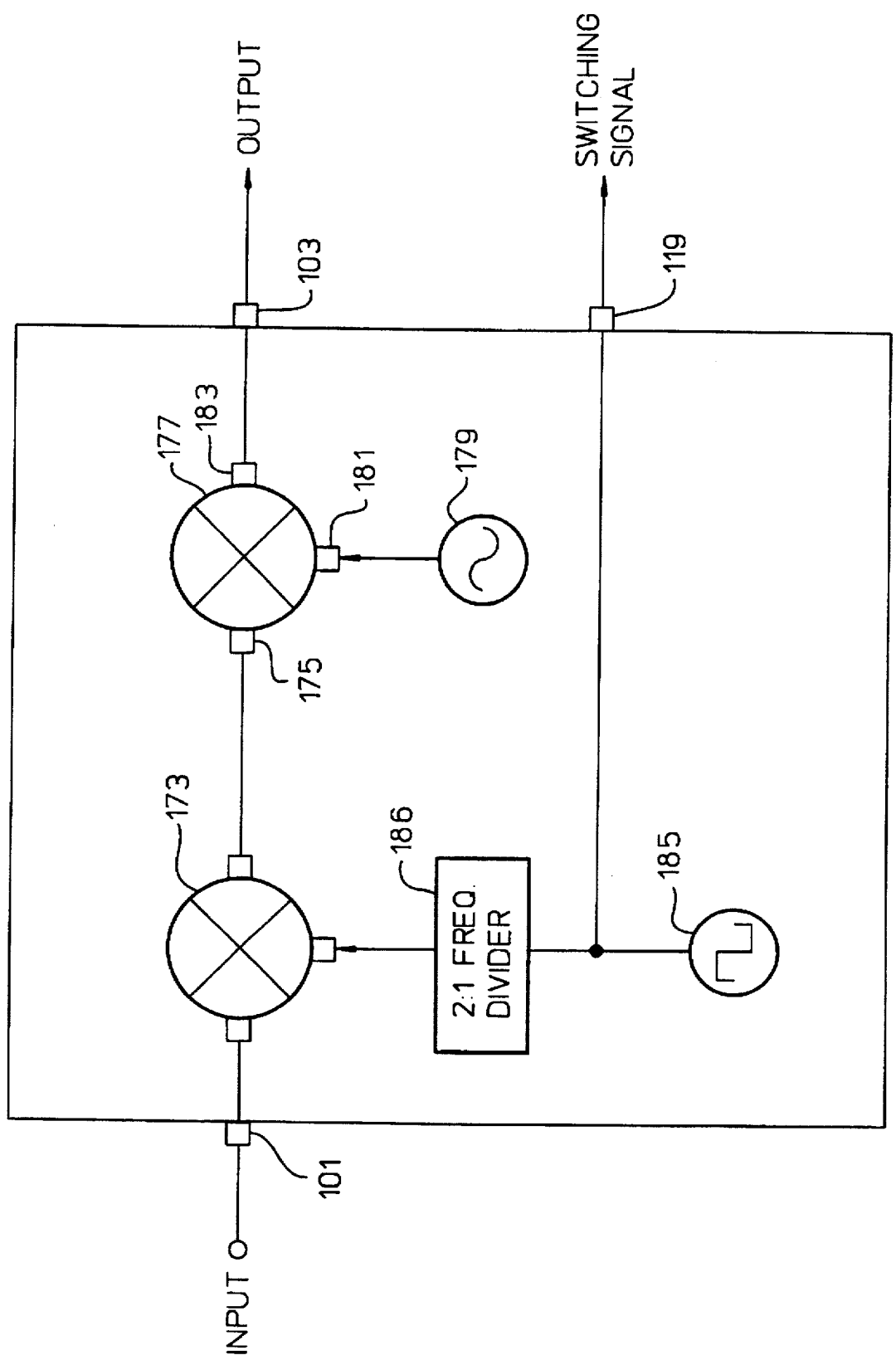
FIG. 8 is a block diagram of a time-share mixer circuit that includes a clocked inverter in series with the primary input port of the mixer according to a fourth embodiment of the invention.

The clocked inverter may be connected in series with either of the input ports of the mixer instead of the output port. This is shown in FIGS. 7 and 8. FIG. 7 shows an embodiment in which a clocked inverter 159 is connected between a local oscillator 161 and an oscillator input port 163 of a mixer 165. The input signal at the port 101 is applied to a primary input port 167 of the mixer and the time-share output signal is provided at a mixer output port 169. The clocked inverter receives a switching signal from a source 171 through a 2:1 frequency divider 172.

FIG. 8 shows an embodiment in which a clocked inverter 173 is connected between the input signal at the input port 101 and a primary input port 175 of a mixer 177. An initial oscillator signal provided by an oscillator 179 is applied to an oscillator input port 181 of the mixer 177, and the time-share output signal is provided at a mixer output port 183. The clocked inverter receives a switching signal from a source 185 through a 2:1 frequency divider 186.

The frequency of the oscillators 161 and 179, like that of the oscillator 143, differs from the frequency $f_{LO}$ by ½ the switching frequency $f_C$.

Using a clocked inverter provides another advantage besides eliminating the need for precision phase shifting of the local oscillator signal. Any power that might leak from the local oscillator back to the mixer input will be at frequencies very different from the range of desired input frequencies even in case of a low first intermediate frequency. Thus, there is less risk of such a power leakage interfering with desired operation of the circuit or with other similar receivers nearby.

Each of the embodiments as described provides an output signal that switches rapidly back and forth between an in-phase signal and a quadrature-phase signal. It may occur that one of these signals is provided for a somewhat longer portion of each switching cycle than the other. In some applications this is undesirable. A time-share circuit that includes a duty-cycle equalizer to correct this problem is shown conceptually in FIG.9. This view is similar to that shown in FIG. 4 and for convenience components that are similar in both views have been given the same reference numerals and will not be discussed further.

Figure 10:
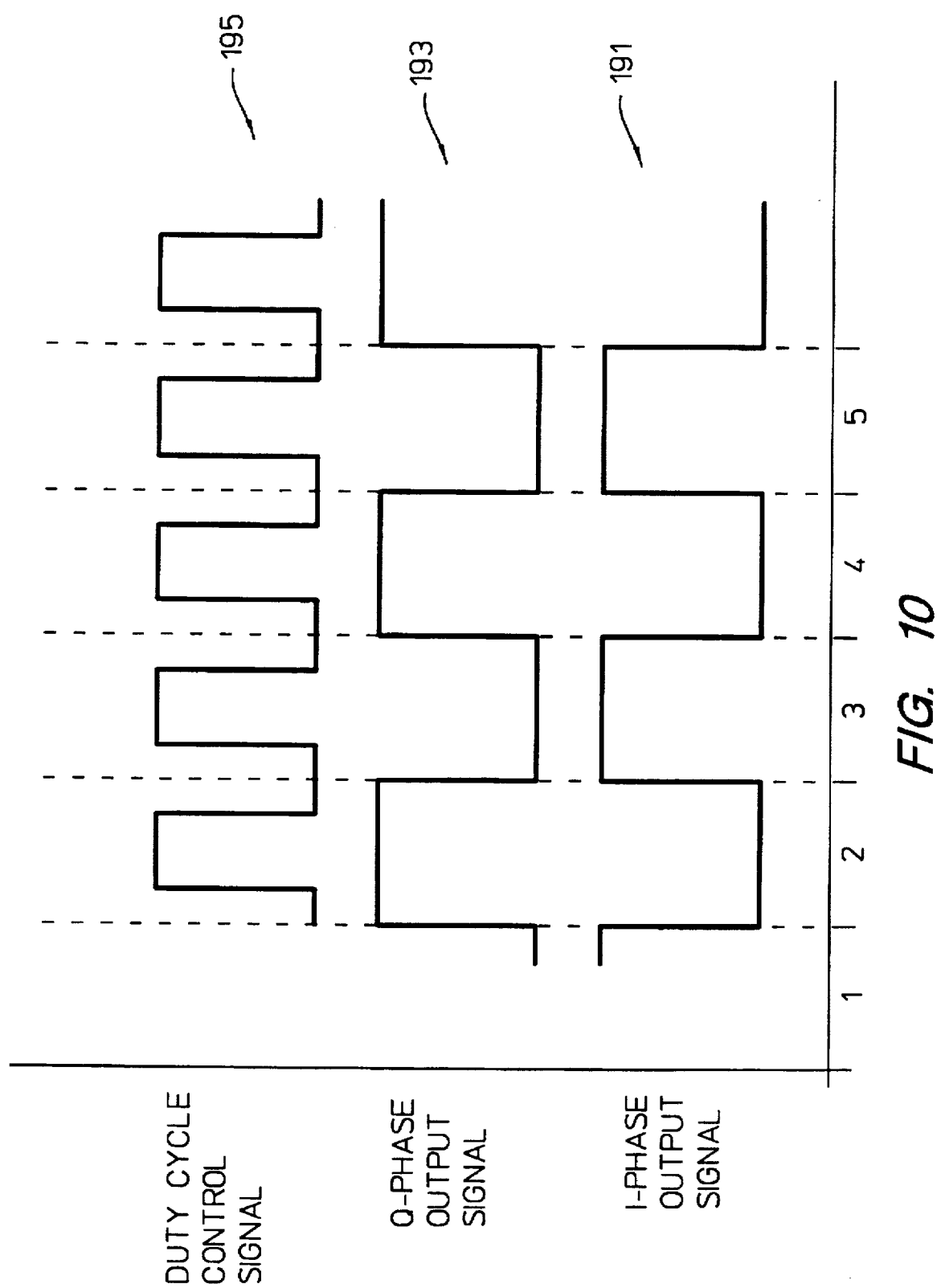
FIG. 10 is a timing diagram showing the relation between the switching signal and the signal that controls the duty-cycle equalizer shown in FIG. 9.

The duty-cycle equalizer includes a duty-cycle signal source 187 that provides a duty-cycle control signal having a frequency that is an even multiple of that of the switching signal and a duty-cycle circuit element 189 responsive to the duty-cycle control signal to alternately enable the in-phase and quadrature-phase output signals for equal periods of time. The timing of the output signals and the duty-cycle control signal for the case in which the frequency of the duty-cycle signal is double that of the switching signal is illustrated in FIG. 10. Presence of the in-phase signal at the output port 103 is indicated by a HI logic level of the bottom trace 191, and presence of the quadrature-phase signal at the output port 103 is indicated by a HI logic level of the middle trace 193. The duty-cycle circuit element 189 is in a conducting state only when the duty-cycle control signal is at a HI logic level. The duty-cycle control signal, shown as the upper trace 195, is timed to be HI during a portion of the time that the in-phase signal is being provided at the output port 103 and during a portion of the time that the quadrature-phase signal is being provided at the output port 103. So long as each of these output signals is present for at least as long a time as the duty-cycle circuit element is in a conducting state, each output signal will be present at the output port for exactly as long a time as the other.

For convenience in illustration, the switching signal source 115 and the duty-cycle signal source 187 are shown as separate signal generators. If separate generators are used in an actual implementation, they should be synchronized as indicated by a dotted line 197 extending from one to the other in FIG. 9. Of course, a single oscillator equipped with suitable frequency-dividing circuitry may serve as the source of both signals.

Figure 9:
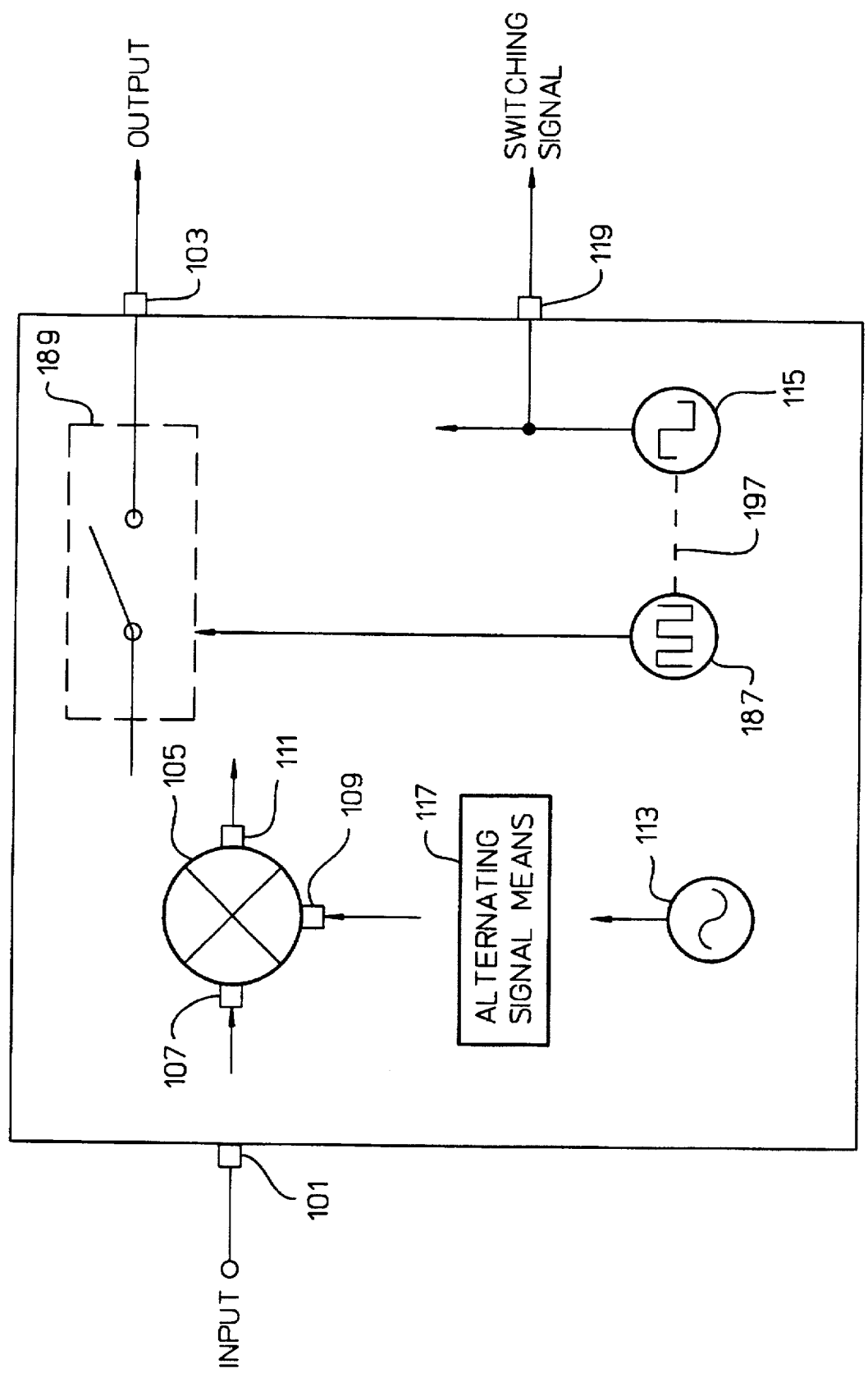
FIG. 9 is a conceptual diagram of a time-share mixer circuit similar to that shown in FIG. 4 and also including a duty-cycle equalizer.
Figure 11:
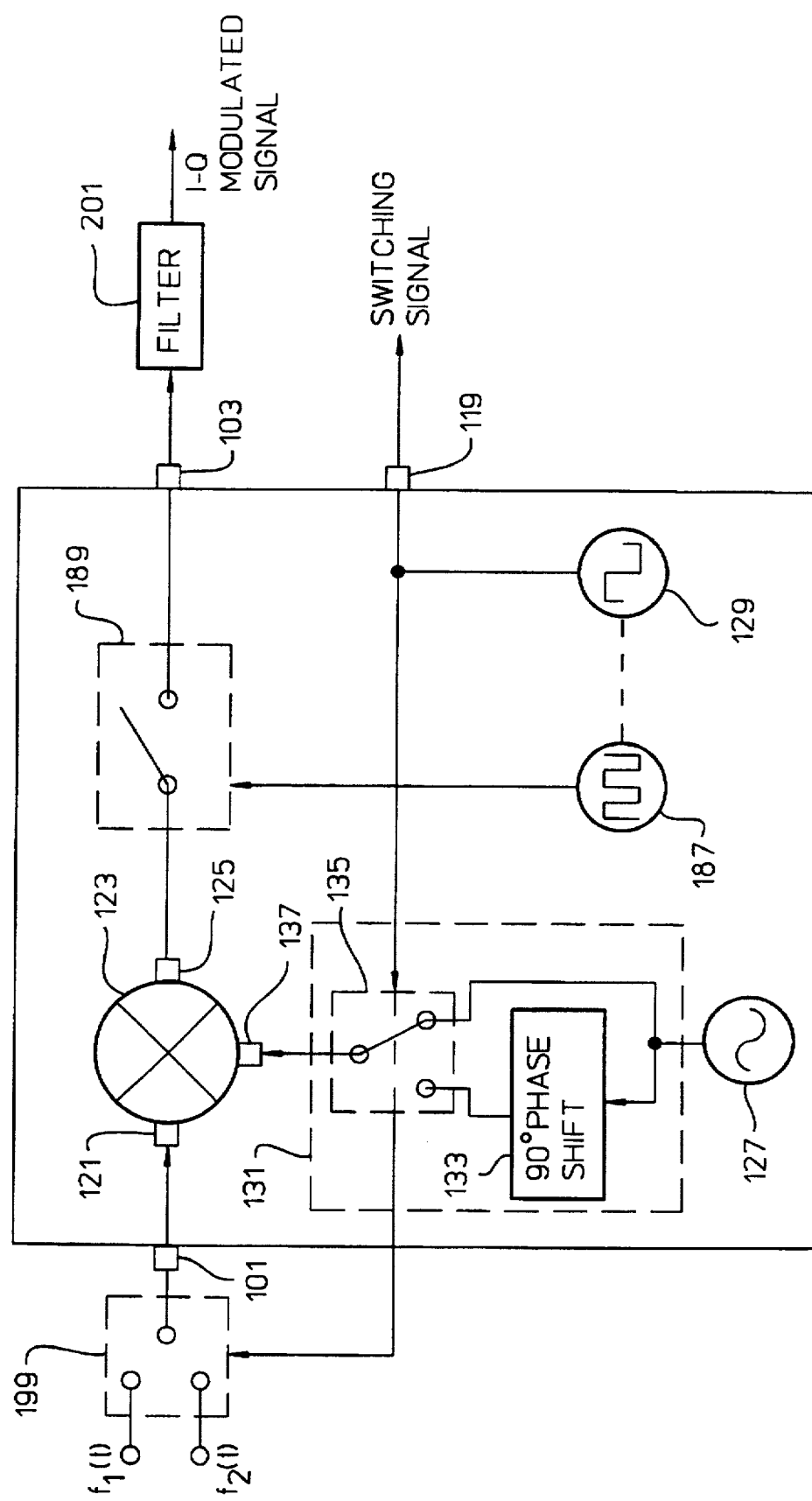
FIG. 11 is a block diagram of an I-Q modulator that includes a time-share mixer circuit similar to that shown in FIG. 5A.

An I-Q modulator embodying the teachings of the invention is shown in FIG. 11. The modulator includes an I-Q switching element 199 and a time-share mixer circuit of the kind described and illustrated previously. The modulator as illustrated includes a time-share mixer similar to the one shown in FIG. 5A in combination with a duty-cycle equalizer similar to the one shown in FIG. 9, but it will be apparent that one of the other time-share mixers could be used instead and that the duty-cycle equalizer may be omitted if desired. For convenience, components in FIG. 11 that are similar to components in FIGS. 5 and 9 are given the same reference numerals and will not be discussed further except as necessary.

The I-Q switching element 199, under control of the switching signal provided by the switching signal source 129, provides an input signal to the primary input port 121 of the mixer 123. The switching element 199 alternates back and forth between a first input signal $f_1(t)$ and a second input signal $f_2(t)$. At the same time, the local oscillator signal as applied to the input port 137 of the mixer is alternated back and forth between two signals having the same frequency but differing in phase by 90°. During those times that the switching element 199 couples the first signal $f_1(t)$ to the mixer, the mixer receives the local oscillator signal with no phase shift and provides at its output the in-phase signal, that is, a signal with a carrier frequency as provided by the local oscillator and modulated with the first input signal $f_1(t)$. During those times that the switching element 199 couples the second signal $f_2(t)$ to the mixer, the mixer receives the local oscillator signal with a 90° phase shift and provides at its output the quadrature-phase signal, that is, a signal with a carrier frequency as provided by the local oscillator and modulated with the second input signal $f_2(t)$. The mixer output, after passing through the duty-cycle equalizer, is filtered by a bandpass filter 201 to provide the I-Q output signal modulated with both input signals.

Figure 12:
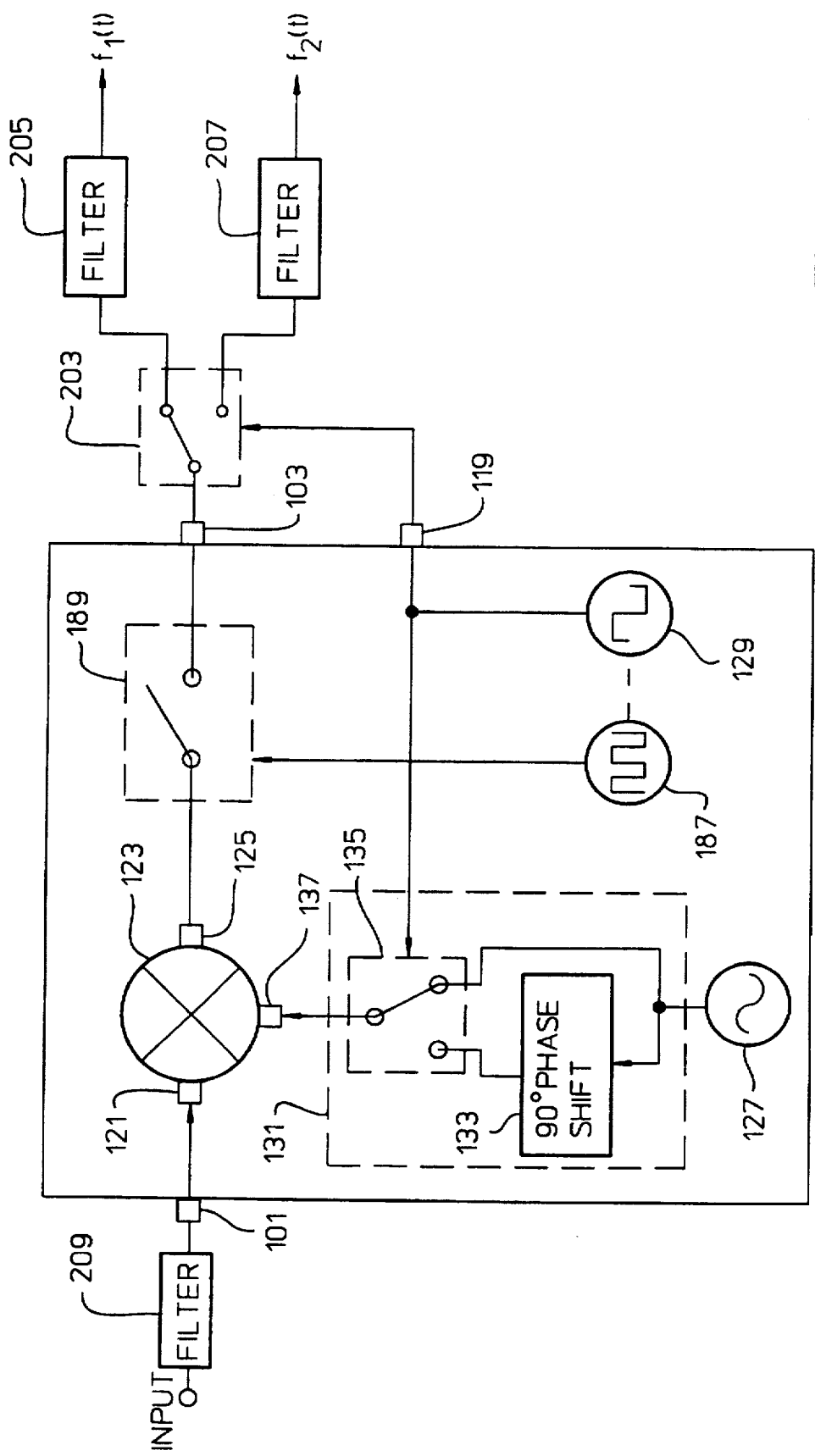
FIG. 12 is a block diagram of an I-Q demodulator that includes a time-share mixer circuit similar to that shown in FIG. 5A.

An I-Q demodulator embodying the teachings of the invention is shown in FIG. 12. The demodulator includes an I-Q switching element 203 in combination with a time-share mixer circuit of the kind described and illustrated previously and a pair of filters 205 and 207. The demodulator as illustrated includes a time-share mixer similar to the one shown in FIG. 5A, but it will be apparent that one of the other time-share mixers could be used instead and that a duty-cycle equalizer may be provided if desired. For convenience, components in FIG. 12 that are similar to components in FIG. 5A are given the same reference numerals and will not be discussed further except as necessary.

The I-Q switching element 203, under control of the switching signal, alternately couples the mixer output to the first low-pass filter 205 and to the second low-pass filter 207. During those times that the switching element couples the output to the first low-pass filter, the mixer is receiving the local oscillator signal without phase shift and is demodulating the input signal to provide the in-phase portion. During those times that the switching element couples the output to the second low-pass filter, the mixer is receiving the local oscillator signal with a 90° phase shift and is demodulating the input signal to provide the quadrature portion. The low-pass filters smooth the switched inputs that they receive to provide the first and second signals, respectively, at the filter outputs.

If the information carried by the first and second input signals has no DC component, then the filters 205 and 207 may optionally be designed not to pass DC. In this event, these filters would, strictly speaking, be termed "bandpass" filters because their frequency response would not extend all the way down to DC whereas a true "low pass" filter has a frequency response that extends to DC. However, in either ease the filters perform the smoothing function to provide the demodulated first and second signals.

Using a clocked inverter rather than switching between two local oscillator signals that must be precisely 90° out of phase with each other eliminates the need for the precise phase control of the oscillator signal and the precision that is required of the switching element. Using the clocked inverter requires that the local oscillator frequency $f_{LO}$ be shifted either up or down by an amount equal to one-half the switching frequency $f_C$. The phasor of this shifted local oscillator frequency rotates relative to the phasor of the original local oscillator frequency $f_{LO}$ by 180° per full cycle of the switching signal $f_C$. Consider four consecutive half-cycles (that is, two consecutive cycles) of the switching signal. The average phase difference between the shifted and original local oscillator signals in each of the four half cycles will be incrementing by 90°. By assigning an arbitrary reference frame, the four averages can be assigned the values 0°, 90°, 180°, and 270°. Controlling the clocked inverter with a signal having one-half the frequency of the switching signal alternately inverts and does not invert the polarity of the shifted local oscillator signal such that each of the two states (the inverted state and the non-inverter state) lasts for one full cycle of the switching signal. Due to the polarity inversion (the 180° phase shift), during every other cycle of the switching signal the 180° average phase shift is shifted by another 180°, resulting in a net average phase shift of 0°. Similarly, the 270° average phase shift is shifted by an additional 180°, resulting in a net average phase shift of 270°+180°=90°. Thus the average phase shift between the shifted and original local oscillator frequencies will be 0°, 90°, 0°, and 90° during four consecutive half-cycles of the switching signal $f_C$.

In summary, the clocked inverter replaces the switching element that switches back and forth between two local oscillator signals that are 90° out of phase with each other with an alternation of phase angles each sweeping over 90° during each half-cycle and with an average phase difference of 90°. Provided a subsequent circuit, such as a bandpass or low pass filter, has the property of averaging its input over an averaging time significantly longer than the period of the switching signal $f_C$, the result of using the clocked inverter is fully equivalent to the result of switching back and forth between two local oscillator signals 90° out of phase with each other.

Figure 13:
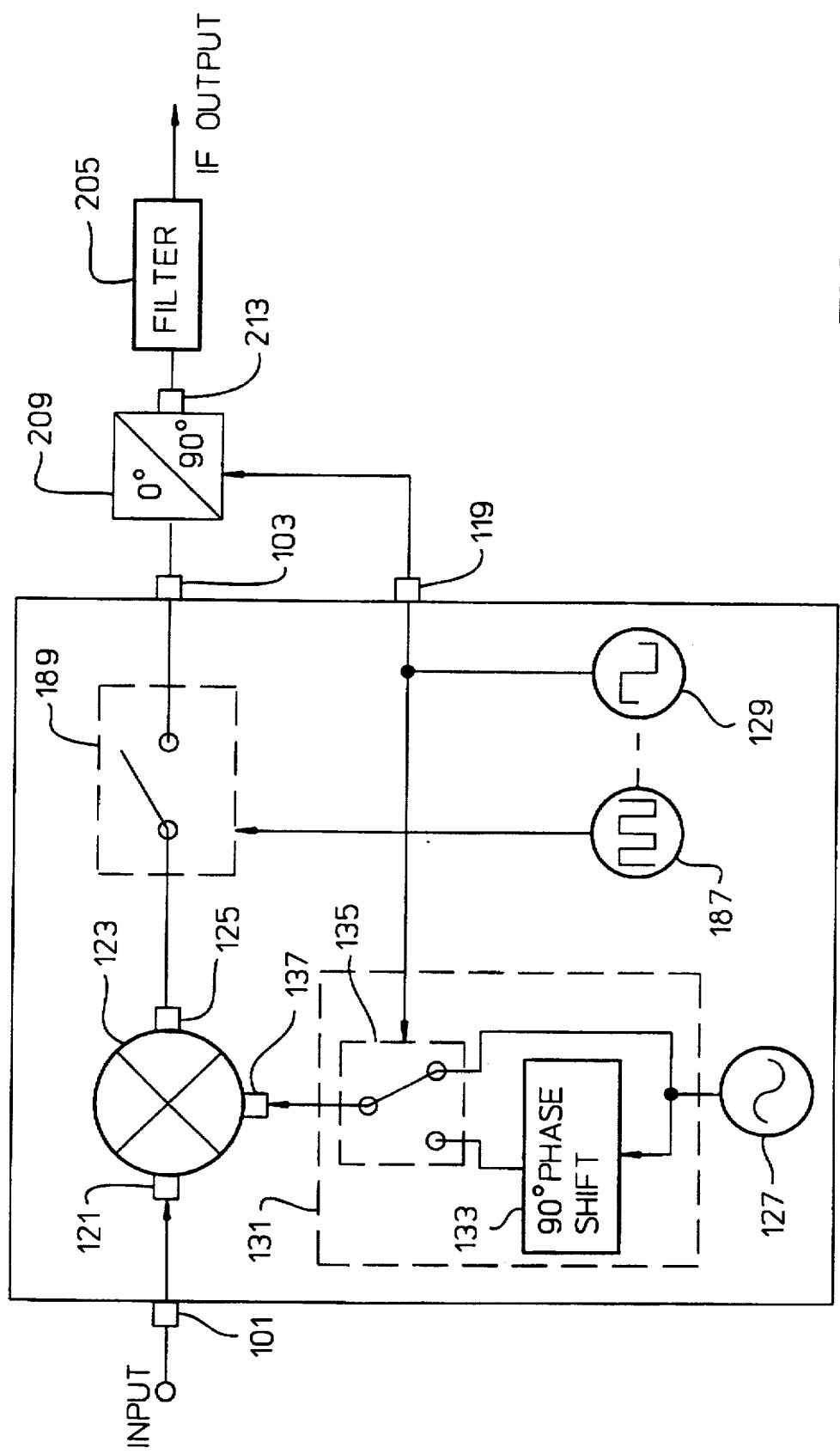
FIG. 13 is a block diagram of a frequency converter that includes a time-share mixer circuit similar to that shown in FIG. 5A.

An image rejecting frequency converter according to the invention is shown in FIG. 13. This converter includes a time-share mixer similar to the one shown in FIG. 5A in combination with a duty-cycle equalizer similar to the one shown in FIG. 9, but it will be apparent that one of the other time-share mixers could be used instead and that the duty-cycle equalizer may be omitted if desired. For convenience, components in FIG. 13 that are similar to components in FIGS. 5 and 9 are given the same reference numerals and will not be discussed further except as necessary.

In addition to the time-share mixer, the frequency converter includes an output phase shifter 209 and a bandpass filter 211. The output phase shifter 209 receives the time-share mixer output from the port 103 and, responsive to the switching signal, alternately shifts the phase of the time-share output signal by first and second phase shifts, the second phase shift differing from the first by 90 degrees. The bandpass filter receives the phase-shifter output signal from a phase-shifter output port 213 and in turn provides the desired frequency-shifted signal.

The operation of the frequency converter as shown in FIG. 13 may be compared with the prior-art frequency converter shown in FIG. 1. In the circuit of FIG. 1 both the non-phase-shifted and the phase-shifted local oscillator signals are continuously mixed with the input signal in their respective mixers 11 and 13, but in the circuit of FIG. 13 the single mixer 123 alternates between the non-phase-shifted and the phase-shifted local oscillator signals. In FIG. 1 the second phase shifter 21 is always active on the output of the mixer 13, but in FIG. 13 the output phase shifter 209 switches back and forth in time with the switching of the local oscillator phase shifter. The summing function in FIG. 1 is performed by the summer 19. In FIG. 13, this function is performed inherently by the bandpass filter 211 which averages the two signals that are alternately presented to it. The switching frequency should be significantly higher than the bandwidth of the bandpass filter 211 to assure that the bandpass filter smoothly averages the alternating signals. The elimination of parallel signal paths, parallel mixers, and a summer with parallel inputs eliminates any problem of imbalance in those components and therefore greatly improves the image rejection capability of the circuit.

The bandpass filter 211 is typically included in the first IF amplifier stage, although the filter 211 may be provided as a separate component if desired.

The switching element 135 must have the same gain in both of its positions. However, this requirement may be relaxed if the local oscillator signal is strong enough to drive the mixer 123 into saturation. In this case, the mixer gain is largely independent of the local oscillator signal amplitude as provided to the mixer by the switching element 135.

The output phase shifter 209 must have the same gain for both phase shifts. The exact amount of gain is not critical, but the bandpass filter 211 is canceling the undesired image signal by averaging the alternating components, and perfect cancellation can only be achieved if the time-voltage product of the two components is in balance. Unequal gain between the two phase shifts provided by the phase shifter 209 may be compensated for by adjusting the duty cycle of the switching signal away from 50% as needed.

The duty-cycle element 189 may be placed anywhere between the mixer 123 and the bandpass filter 211. The optimum placement depends on the implementation of the phase shifter 209. Alternatively, the duty-cycle element 189 can be placed between the oscillator signal switching element 135 and the oscillator input port 137 of the mixer 123. The important aspect of the duty-cycle element 189 is that it provides a means for sampling the output of the mixer for a time period that is independent of the ratio of the times for which the two quadrature components are applied to the oscillator input port.

While the time sharing approach taught in the present invention substantially reduces the image rejection problems present in prior art frequency converters, there is one problem specific to the time-sharing concept that is worthy of note. Although the conventional unwanted image signal is suppressed by cancellation, new unwanted image signals are created. The frequencies of these new image signals are given by $$f_T(m) = f_U \pm m f_C \qquad (23)$$

where $f_T(m)$ is the mth image frequency, m is any odd integer, $f_U$ is the frequency of the original unwanted image signal, and $f_C$ is the switching frequency. These unwanted frequencies can be suppressed by selecting a sufficiently high switching frequency $f_C$.

For example, in a conventional receiver having an intermediate frequency of 1 MHz, the undesired image frequency will be $2f_{IF}$ less than the desired frequency. Thus, if the desired receiver range is 902 to 928 MHz, the unwanted image frequencies will have a range of 900 to 926 MHz. In a receiver embodying a frequency converter according to the invention, a switching frequency $f_C$=200 MHz will create time-sharing images $f_T(m)$ at least 200 MHz away from $f_U$. The resulting guard band between the range of the desired frequencies and the nearest of the unwanted image frequencies will be wider than 170 MHz. This guard band is large enough that the time-share image signals can be suppressed by an inexpensive input filter positioned before the mixer.

Figure 14:
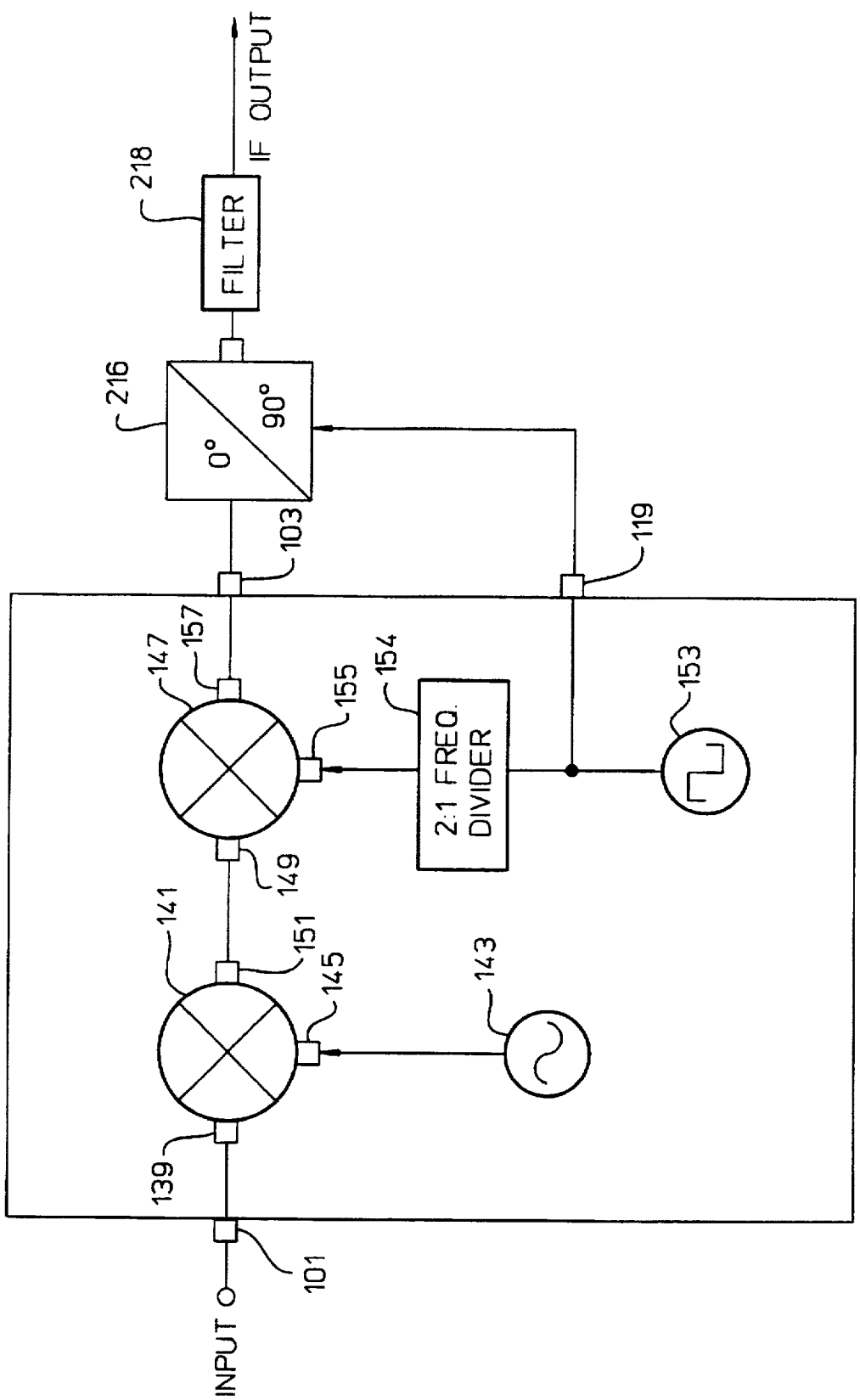
FIG. 14 is a block diagram of a frequency converter similar to that shown in FIG. 13 but using a clocked inverter time-share mixer similar to that shown in FIG. 6.

As has already been mentioned, a preferred embodiment of a frequency converter according to the principles of the invention utilizes a clocked inverter rather than a switched phase shifter in series with the local oscillator. An example of such a frequency converter is shown in FIG. 14. A time-share mixer 214, similar to the one shown in FIG. 6, receives an input at its input port and provides an output at its output port 103 to a phase shifter 216 that is similar to the phase shifter 209 of FIG. 13. The phase shifter 216 in turn is connected to a bandpass filter 218 to provide a frequency-converted signal.

For a given input signal having a frequency $f_D$, the frequency $f_{LC}$ of the oscillator 143 of FIG. 14 will not be the same as would the frequency $f_{LO}$ of the oscillator 127 of FIG. 13 for the same input frequency. From equation (3) above ($f_D = f_{LO} + f_{IF}$) the frequency $f_{LO}$ of the oscillator 127 must be set to $f_{LO} = f_D - f_{IF}$. However, the frequency $f_{LC}$ of the oscillator 143 must differ from this frequency $f_{LO}$ by an amount equal to ½ the switching frequency $f_C$. Thus the frequency $f_{LC}$ of the oscillator 143 is given by $$f_{LC} = f_D - f_{IF} \pm \tfrac{1}{2} f_C \quad (24)$$

The operation of the circuit of FIG. 14 will now be described in more detail. Assume, as in (5) above, an input signal of the form $$D(t) = D \sin(\omega_D t + \phi_D) \quad (25)$$

where D is the amplitude of the desired input signal, $\omega_D$ is the angular frequency, and $\phi_D$ is the phase. The phase angle $\phi_D$ will be disregarded. The mixer 141 combines the desired input signal $D(t)$ with the local oscillator signal, which may be expressed as $\cos(\omega_{LC} t)$. The resulting mixer output signal D' includes the term:

$$\tfrac{1}{2} D \sin(\omega_D - \omega_{LC})t \quad (26)$$

and another term of different frequency that will not survive the subsequent filtering and will therefore be disregarded, as was explained previously with respect to the first mixer of FIG. 1. Thus for present purposes D' may be expressed as $$D' = \tfrac{1}{2} D \sin(\omega_D - \omega_{LC})t \quad (27)$$

Substituting $\omega_D = \omega_{LC} + \omega_{IF}$ and $\omega_{LC} = \omega_{LO} - \omega_C/2$ into (26) yields $$D' = \tfrac{1}{2} D \sin(\omega_C/2 + \omega_{IF})t \quad (28)$$

as the signal that is presented to the input port of the clocked inverter 147.

Figure 15:
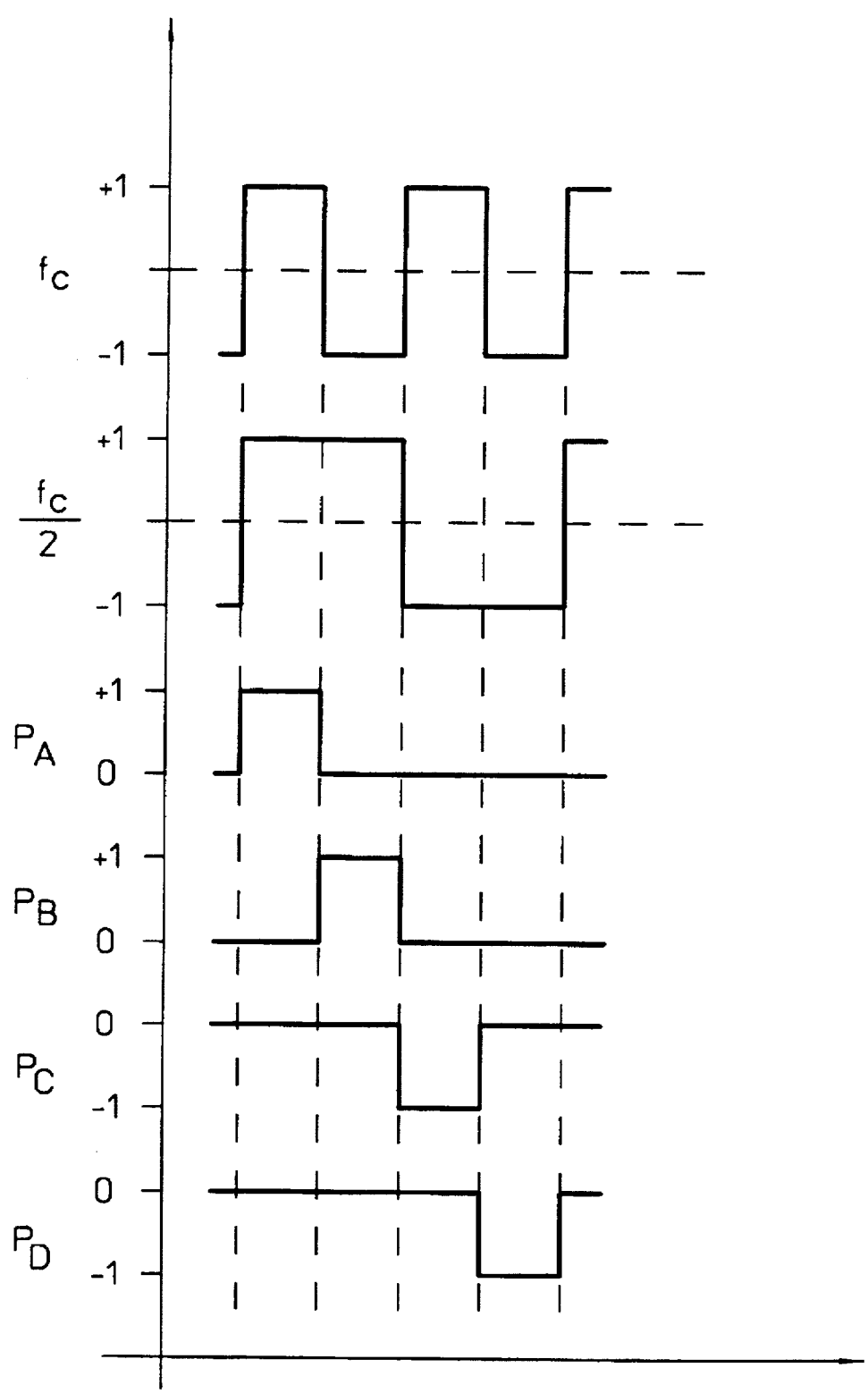
FIG. 15 is a timing diagram of the switching signals of the circuit of FIG. 14.

The action of the clocked inverter, and the action of the switching at frequency $f_C$ can be described as chopping its input signal D' by four consecutive chopping pulses $P_A$, $P_B$, $P_C$ and $P_D$. This may be seen by reference to FIG. 15, which shows in vertical alignment two cycles of the switching frequency $f_C$, one cycle of $f_C/2$, and the four pulses $P_A$, $P_B$, $P_C$ and $P_D$ each of which has a frequency $f_C/2$ and a duty cycle of 25%. These four pulses have a DC component, but when multiplying the signal $D' = \tfrac{1}{2} D \sin(\omega_C/2 + \omega_{IF})t$ by these pulses, the DC component results only in a frequency of $\omega_C/2 + \omega_{IF}$ which will not survive later bandpass filtering.

Thus the DC components may be neglected. The AC spectra of the four pulses are given by:

$$P_A: (2/(n\pi)) \sin(n\pi/4) \cos(n(\omega_C t/2 - \pi/4)) \quad (29a)$$

$$P_B: (2/(n\pi)) \sin(n\pi/4) \cos(n(\omega_C t/2 - 3\pi/4)) \quad (29b)$$

$$P_C: (2/(n\pi)) \sin(3n\pi/4) \cos(n(\omega_C t/2 - \pi/4)) \quad (29c)$$

$$P_D: (2/(n\pi)) \sin(3n\pi/4) \cos(n(\omega_C t/2 - 3\pi/4)) \quad (29d)$$

where n is any non-zero positive integer.

For convenience let $N_{AB} = (2/(n\pi)) \sin(n\pi/4)$ and $N_{CD} = (2/(n\pi)) \sin(3n\pi/4)$. Then multiplying D' by each of the four pulses and using the trigonometric identity for $\sin x \cos y$ yields:

$$D'P_A = D(N_{AB}/4)(\sin((1+n)\omega_C t/2 + \omega_{IF} t - n\pi/4) + \sin((1-n)\omega_C t/2 + \omega_{IF} t + n\pi/4)) \quad (30a)$$

$$D'P_B = D(N_{AB}/4)(\sin((1-n)\omega_C t/2 + \omega_{IF} t - 3n\pi/4) + \sin((1-n)\omega_C t/2 + \omega_{IF} t + 3n\pi/4)) \quad (30b)$$

$$D'P_C = D(N_{CD}/4)(\sin((1+n)\omega_C t/2 + \omega_{IF} t - n\pi/4) + \sin((1n)\omega_C t/2 + \omega_{IF} t + n\pi/4)) \quad (30c)$$

$$D'P_D + D(N_{CD}/4)(\sin((1+n)\omega_C t/2 + \omega_{IF} t - 3n\pi/4) + \sin((1-n)\omega_C t/2 + \omega_{IF} t + 3n\pi/4)) \quad (30d)$$

Components of these four products that have a frequency $\omega_{IF}$, which are the only components that will survive bandpass filtering centered on that frequency, only exist for $n=1$, in which case $N_{AB} = N_{CD} = (2/\pi)\sin(\pi/4)$. Thus:

$$D'P_A = D'P_C = D(N_{AB}/4) \sin(\omega_{IF} t + \pi/4) \quad (31)$$

and $$D'P_B = D'P_D = D(N_{AB}/4) \sin(\omega_{IF} t + 3\pi/4). \quad (32)$$

The first two signals $D'P_A$ and $D'P_C$ occur in the first half of the cycle of the switching signal $f_C$ and thus these two signals pass through the clocked inverter with no phase shift. The other two signals $D'P_B$ and $D'P_D$ occur in the second half cycle of the switching signal and therefore are phase shifted by 90°, resulting in the following expression for each of the last two after passing through the clocked inverter:

$$D''P_B = D''P_D = D(N_{AB}/4) \sin(\omega_{IF} t + 3\pi/4 - \pi/2) = D(N_{AB}/4) \sin(\omega_{IF} t - \pi/4) \quad (33)$$

All four signals are present in the output. Their sum is:

$$D'P_A + D''P_B + D'P_C + D''P_D = D(N_{AB}/2)(\sin(\omega_{IF} t + \pi/4) + \sin(\omega_{IF} t - \pi/4)) \quad (34)$$

or $$D'P_A + D''P_B + D'P_C + D''P_D = (D/\pi) \sin(\omega_{IF} t). \quad (35)$$

Thus, the desired input signal with angular frequency $\omega_D$ has been convened to an intermediate frequency with angular frequency $\omega_{IF}$.

Similar reasoning shows that the undesired image signal will be cancelled.

Just as using the switched phase shifter in conjunction with the local oscillator 127 introduced an undesired new time-share image frequency in the embodiment of FIG. 13, so the clocked inverter also introduces new undesirable time-share image frequencies. The clocked inverter introduces the same image frequencies as does the circuit of FIG. 13. In addition to those image frequencies, the clocked inverter introduces a set of image frequencies $f_T(q)$ which are given by $$f_T(q) = f_D \pm q f_C \tag{36}$$

where q is an even non-zero integer. These new time-sharing image frequencies can also be suppressed by choosing a switching frequency $f_C$ that allows for a sufficient guard band.

The frequency converting circuits illustrated in FIGS. 13 and 14 use an analog phase shifter 209. A preferred implementation of such a phase shifter meets at least two conditions. First, the two paths generating the two phase shifts must share the same circuitry as much as possible. This minimizes balance errors due to circuit component mismatches. Second, the implementation must not require a high gain amplifier operating at a wide bandwidth, since one of the reasons for utilizing a time-shared mixer is to avoid such wide-bandwidth, high-gain amplifiers.

Figure 16:
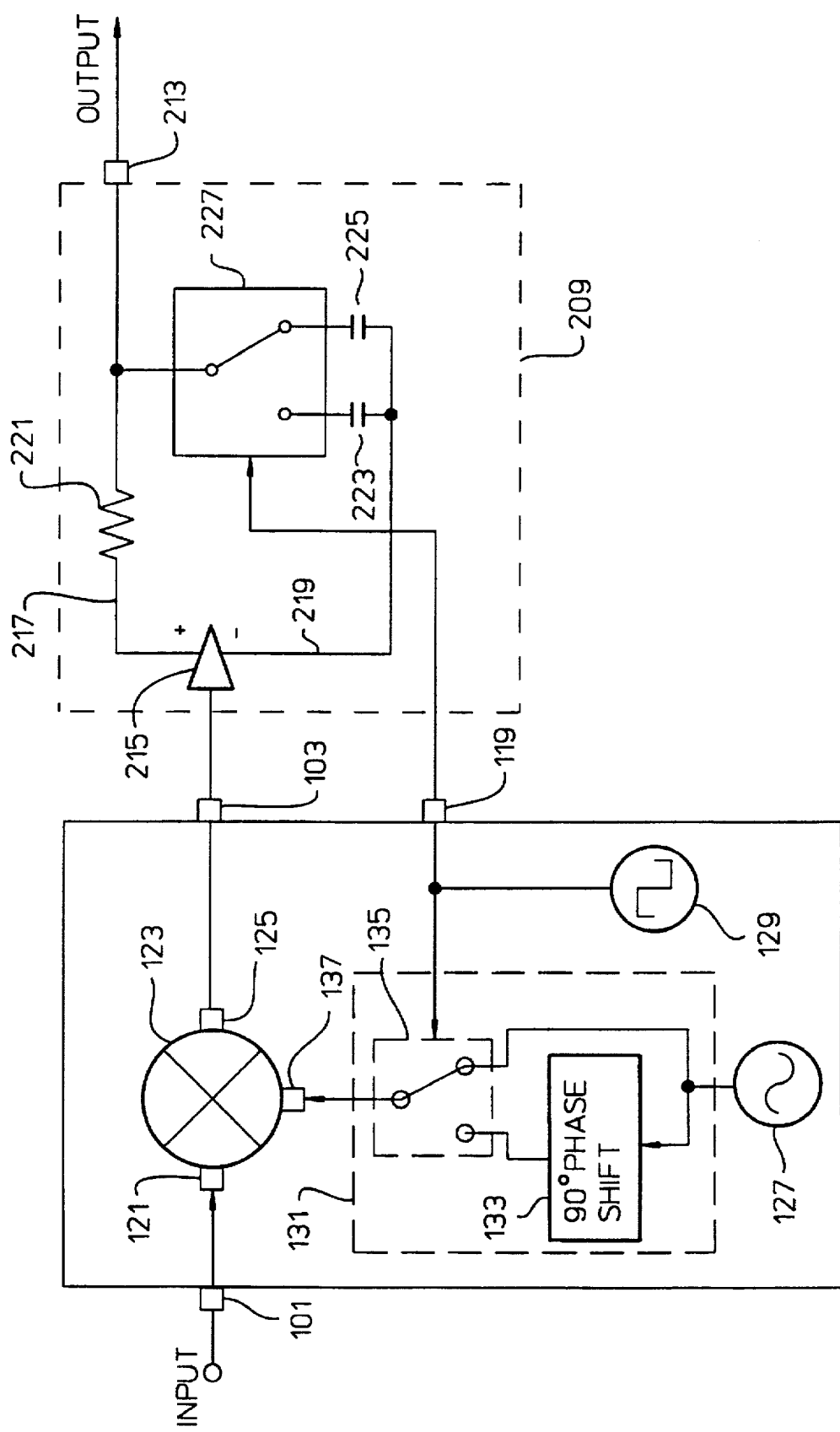
FIG. 16 is a block diagram of a frequency converter similar to that shown in FIG. 13 and illustrating in partial schematic form a particular embodiment of the phase shifter.

One implementation of a suitable analog phase shifter is shown in FIG. 16. This circuit similar to the one shown in FIG. 13; similar components have the same reference numerals and will not be discussed further. An amplifier 215 receives the time-share mixer output signal from the output port 103 of the time-share mixer. The amplifier 215 provides complementary outputs +V and −V at first and second amplifier outputs 217 and 219, respectively. The first output 217 is connected to a resistor 221 which in turn is connected to the output port 213. The second output 219 is connected to two capacitors 223 and 225 which in turn are connected to first and second terminals of a switching element 227. The switching element 227 has a pole connected to the output port 213. The switching element 227 is controlled by the switching signal.

The values of the resistor 221 and the capacitors 223 and 225 are chosen to generate two signals with a relative phase shift of 90°. For example, the respective phase shifts may be 45° and 135°. In choosing the values of these components, it should be noted that the capacitors are connected to the resistor only during a fraction p and (1−p) of time, where p is the switching duty cycle (ideally p=50%). An error in the duty cycle would result in a proportional error in the effective ratio of the two capacitors and hence in the relative phase shifts of the two signals. Of course, the duty cycle could be deliberately adjusted to compensate for any error in the values of the capacitors.

Figure 17:
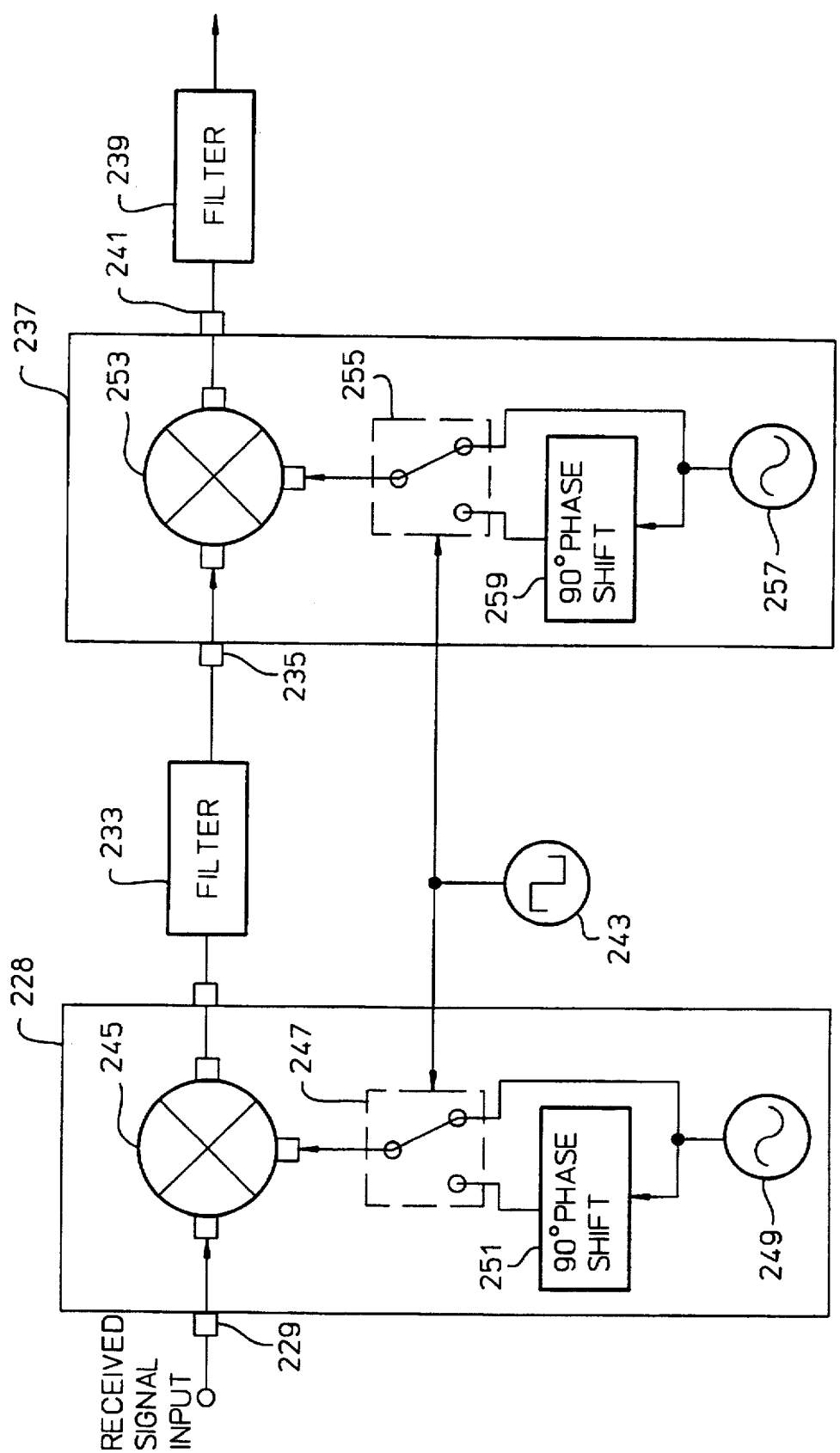
FIG. 17 is a block diagram of a frequency converter similar to that shown in FIG. 13 but using a second time-share mixer circuit as the phase shifter.

A frequency converter which utilizes a second time-share mixer to provide the phase shift is shown in FIG. 17. A first time-share mixer circuit generally 227 receives an input signal at its input port 229 and provides an output at its output port 231. The output port 231 connects through a bandpass filter 233 to an input port 235 of a second time-share mixer circuit generally 237 which serves as a phase shifter. The phase shifter 237 provides an output to a bandpass filter 239 at its output port 241.

In the embodiment as illustrated, the time-share mixer circuits 228 and 237 are each similar to the embodiment shown in FIG. 5A except that a single switching signal source 243 provides the switching signal for both circuits. The circuit 228 includes a mixer 245 that receives the input signal presented to the input port 229 and provides the output to the output port 231. The mixer 245 has an oscillator input that is alternately connected by a switching element 247 to a local oscillator 249 and to a phase shifter 251 that shifts the phase of the local oscillator by 90°. Similarly the circuit 237 includes a mixer 253 that receives the input signal presented to the input port 235 and provides the output to the output port 241. The mixer 253 has an oscillator input that is alternately connected by a switching element 255 to a local oscillator 257 and to a phase shifter 259 that shifts the phase of the local oscillator by 90°. The switching signal source drives both switching elements 247 and 255.

In some embodiments a separate switching signal source may be used to drive the switching element 255. This would be the case, for example, if the filter 233 were implemented by a pair of switched filters such as those shown in FIG. 18, which will be discussed presently.

The second time-share mixer circuit 237 will be sensitive to an unwanted image frequency in its input. Such an unwanted image frequency could result from an unwanted signal at the input to the first mixer circuit 228. The filter 233 will reject any such unwanted image frequency. The filter 233 may be implemented by, for example, a low-pass filter similar to the filter 277 shown in FIG. 19, which will be discussed presently.

One or both of the time-share mixer circuits 228 and 237 may be replaced with an alternate embodiment such as one of those shown in FIGS. 6, 7 or 8.

As noted above, a high switching frequency of, e.g., $f_C$=200 MHz is desirable to ensure a sufficient distance between the time-share images and the desired input frequency of the frequency converter. However, the useful information at the output of the phase shifter (209 in FIG. 13) is carried by a signal at an intermediate frequency $f_{IF}$ and therefore can be processed by relatively low frequency circuits such as the bandpass filter 211.

In many applications it would be advantageous to replace the phase shifter 209 and bandpass filter 211 in the circuit of FIG. 13 with more accurate digital signal processing hardware. Digital processing hardware that could process a signal switched at a relatively high frequency such as 200 MHz would draw too much power. Therefore, to take advantage of the capabilities of digital signal processing without excessive power drain, the switching frequency of the signal must be significantly reduced before it is processed by the digital hardware. However, to keep the time-share images away from the desired input frequency, this must be done without reducing the high switching frequency used in the frequency converter circuit. This can be accomplished by filtering the two quadrature components of the time-share mixer output signal separately and replacing the output phase shifter 209 and bandpass filter 211 with digital signal processing circuitry that accomplishes the functions of these components. A circuit that can be used for this purpose is shown in FIG. 18.

Figure 18:
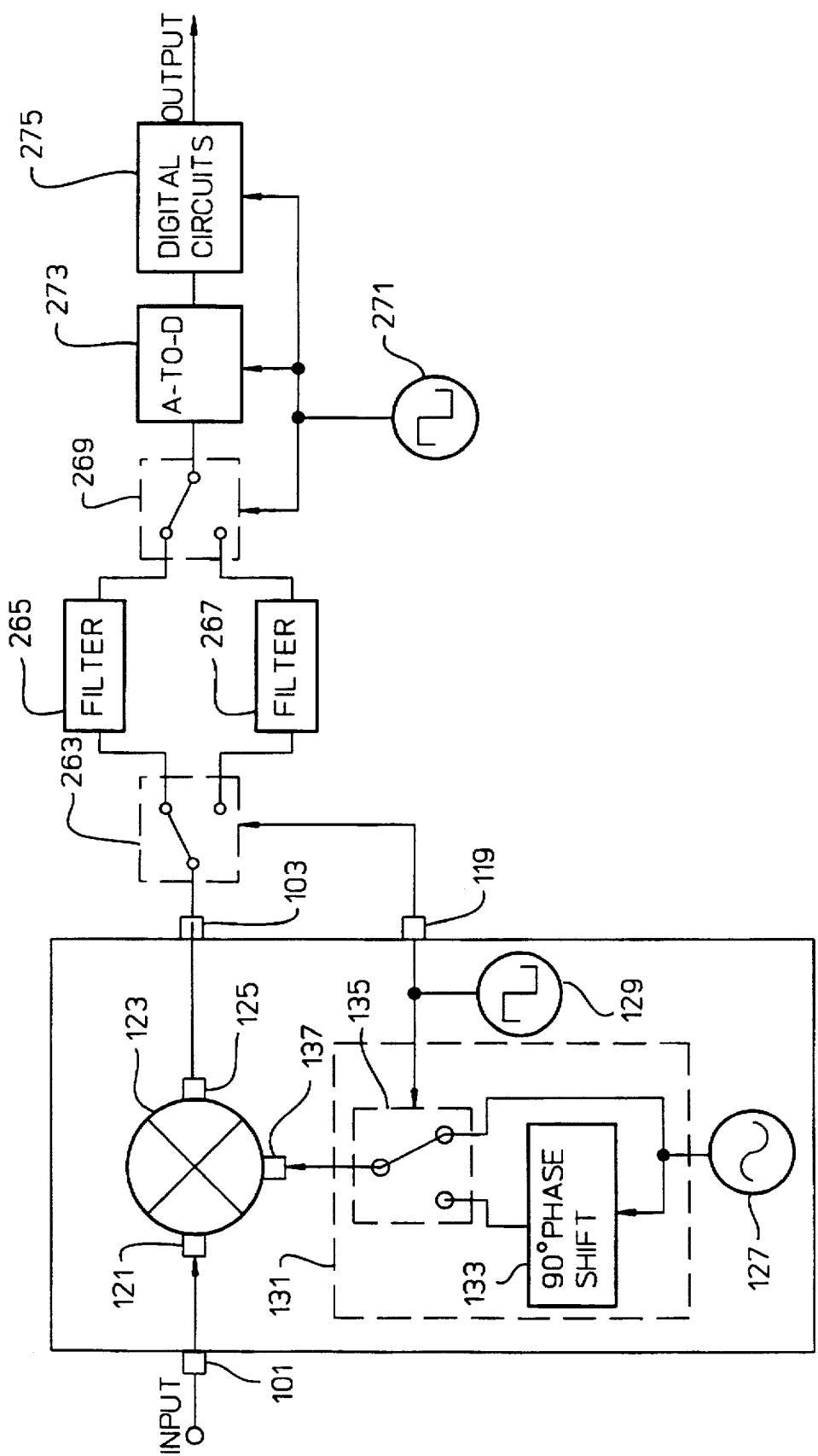
FIG. 18 is a partial schematic diagram of a circuit having two matched filters and digital processing circuitry that may be used in place of the phase shifter used in FIG. 13.

FIG. 18 shows a frequency converter that uses a time-share mixer similar to those discussed above. A time-share mixer 261 generally similar to the circuit shown in FIG. 5A is used in the embodiment as illustrated, but it will be apparent that any of the other time-share mixers discussed and illustrated previously could be used instead. An I-Q switching element 263 controlled by the switching signal receives the output signal from the output port of the time-share mixer 261. The I-Q switching element 263 has two outputs, one of which drives a filter 265 and the other of which drives a filter 267. A second I-Q switching element 269, controlled by a switching signal source 271, alternately connects the outputs of each of the filters 265 and 267 to an analog-to-digital converter 273. The output of the A-to-D converter 273 in turn is provided to a digital phase shifter and summer 275.

The filter 265 may be designated the "I" filter and the filter 267 may be designated the "Q" filter. These filters convert the alternating I and Q components at the output 103 of the time-share mixer circuit 261 into continuous I and Q signal streams, respectively. Therefore the frequency of the signal source 271 may be different than that of the switching signal provided at the switching signal output port 119 of the time-share mixer 261. The frequency of the signal source 271 is preferably chosen low enough to allow digital signal processing without excessive power drain.

To maintain a high degree of image rejection, the filters 265 and 267 must pass the I and Q components of the intermediate frequency signal as provided at the output port 103 of the time-share mixer 261 with well-matched phase shift and gain. This will be facilitated if the filters 265 and 267 share as many components as possible. A circuit in which the two filters share most of their components is shown in FIG. 19.

Figure 19:
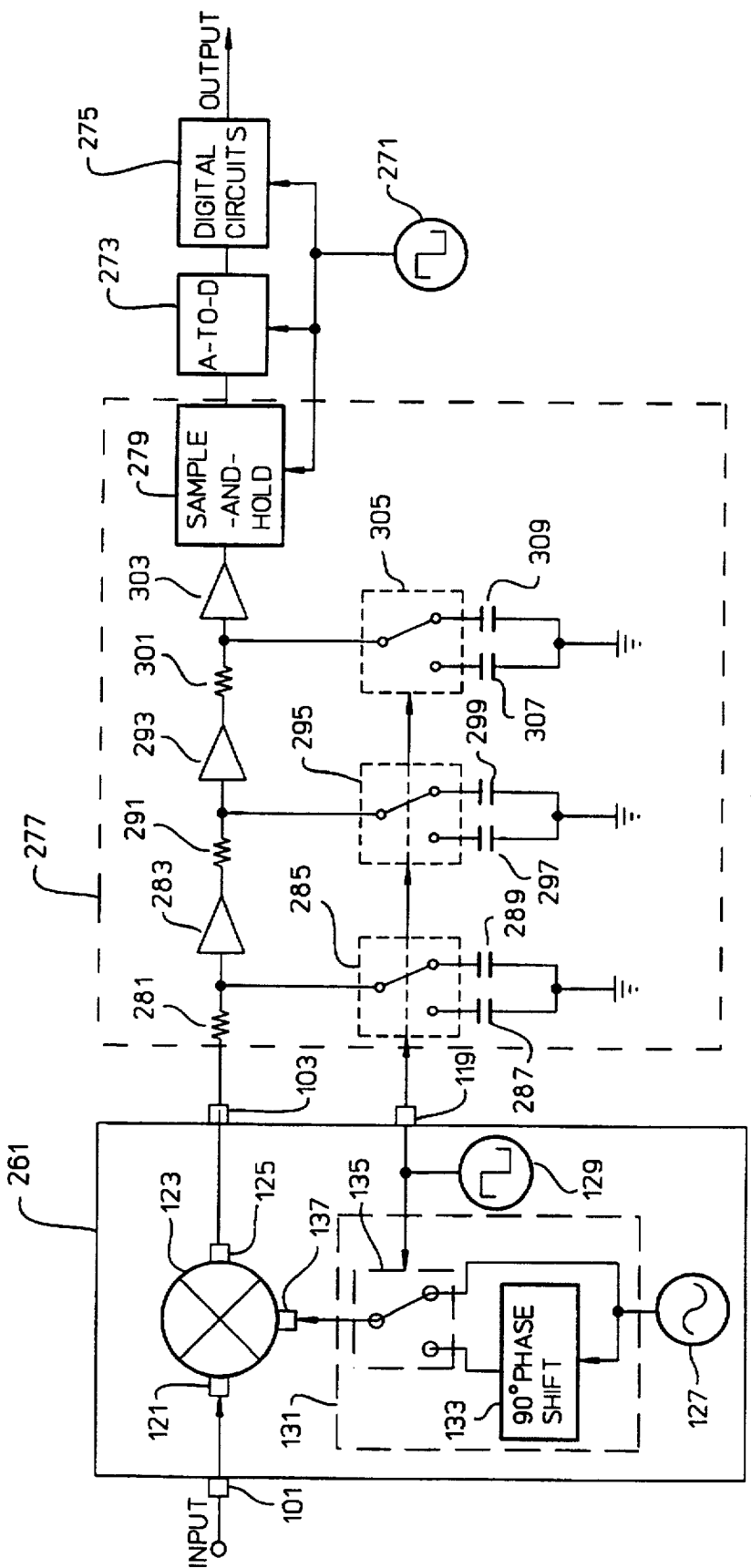
FIG. 19 is a partial schematic diagram of a circuit having a switched low-pass filter and digital processing circuitry that may be used in place of the phase shifter used in FIG. 13.

The circuit of FIG. 19 is in many respects similar to the circuit of FIG. 18, and for convenience similar components have been assigned the same reference numerals in both figures. A low-pass filter circuit generally 277 replaces the I-Q switching elements 263 and 269 and the filters 265 and 267 of FIG. 18. The filter 277 receives the signal from the output port 103 of the time-share mixer 261. The filter 277 comprises a plurality of cascaded RC filter stages and a sample-and-hold element 279. The first such RC filter stage includes a resistor 281 that receives the signal and couples it to an input of an amplifier 283. A switching element 285, driven by the switching signal from the port 119 of the mixer circuit, alternately connects a capacitor 287 and a capacitor 289 to the input of the amplifier 283.

Similarly, the second filter stage includes a resistor 291 that receives the signal from the first filter stage and couples it to an input of an amplifier 293. A switching element 295, driven by the switching signal from the port 119 of the mixer circuit, alternately connects a capacitor 297 and a capacitor 299 to the input of the amplifier 293. The third filter stage includes a resistor 301 that receives the signal from the second filter stage and couples it to an input of an amplifier 303. A switching element 305, driven by the switching signal from the port 119 of the mixer circuit, alternately connects a capacitor 307 and a capacitor 309 to the input of the amplifier 303. The amplifiers are typically emitter or source followers that act as buffers.

The output from the third filter stage is provided to the sample-and-hold element 279 and thence to the A-to-D converter 273. The sample-and-hold element 279 is controlled by the switching signal source 271.

The sample-and-hold 279 has an acquisition aperture shorter than $1/(2f_C)$ but is triggered by a signal provided by the signal source 271 that has a frequency $f_S$ that is chosen to be an odd submultiple of $2f_C$. As a result, samples taken by the sample-and-hold 279 alternate between the quadrature samples taken from the capacitors 287, 297 and 307, and alternate-phase quadrature samples taken from the capacitors 289, 299 and 309. Choosing the frequency $f_S$ of the switching signal source 271 such that $f_S > f_O + f_{IF}$, where $f_O$ is the stop band edge of the low-pass filter 277, prevents any signal coming out of the low-pass filter from aliasing into the IF signal. Because two samples constitute a single reduced-frequency switching cycle, the switched low-pass filter and sample-and-hold circuit in combination have the effect of reducing the switching frequency as it appears in the output of the sample-and-hold from $f_C$ to a new frequency $f_C' = f_S/2$. In a practical case in which $f_C = 200$ MHz, $f_C'$ could be as low as <7 MHz.

The signal provided by the sample-and-hold is converted to digital form in the A-to-D converter 273. Once the signal has been digitized, an accurate 90° phase shift between the two quadrature components is easily accomplished using conventional digital techniques, for example in the digital phase shifter and summer 275.

From the foregoing it will be appreciated that the time-share mixer of the invention provides a frequency converter having capabilities not heretofore attainable in a monolithic receiver. A frequency converter embodying the principles of the invention can reject an unwanted image signal that is as much as 60 dB more powerful than the desired signal. A greatly improved I-Q modulator and demodulator are also provided.

Although various specific embodiments of the invention have been described and illustrated, the invention is not to be limited to the specific forms or arrangements of parts so described and illustrated. The invention is limited only by the claims.

We claim:

1. A time-share mixer circuit that receives an input signal and provides a time-share output signal differing in frequency from the input signal by Δf, the circuit comprising:
    a mixer having a primary input port, an oscillator input port, and an output port;
    a switching signal source that provides a switching signal having a frequency off $f_c 2$;
    a local oscillator that provides an oscillator signal differing in frequency from Δf by the frequency of the switching signal; and
    a clocked inverter in series with a port of the mixer, the clocked inverter operating in response to the switching signal to cause the time-share output signal to alternate between an in-phase output signal and a quadrature-phase output signal, the in-phase output signal being that output signal which the mixer would provide if the input signal were applied to the primary input port and an oscillator signal of frequency Δf were applied to the oscillator input port, the quadrature-phase output signal being that output signal which the mixer would provide if the input signal were provided to the primary input port and the oscillator signal of frequency Δf were phase-shifted by 90 degrees and then applied to the oscillator input port.

2. A time-share mixer circuit as in claim 1, wherein the input signal is applied to the primary input port, the oscillator signal is applied to the oscillator input port, and the clocked inverter is connected in series with the mixer output port to provide the time-share output signal.

3. A time-share mixer circuit as in claim 1, wherein the input signal is applied to the primary input port, the oscillator signal is applied to the oscillator input port through the clocked inverter, and the time-share output signal is provided at the mixer output port.

4. A time-share mixer circuit as in claim 1, wherein the input signal is applied to the primary input port through the clocked inverter, the oscillator signal is applied to the oscillator input port, and the time-share output signal is provided at the mixer output port.

5. An I-Q modulator, comprising:
    a time-share mixer circuit as in claim 1,
    an I-Q switching element responsive to a switching signal having a frequency of $f_c$ to alternately couple first and second information signals to the input of the time-share mixer circuit; and
    filter means for deriving from the time-share signal an output signal modulated in quadrature with both information signals.

6. An I-Q demodulator, comprising:
    a time-share mixer circuit as in claim 1 that receives a signal modulated in quadrature with first and second information signals;
    a first filter;
    a second filter; and an I-Q switching element responsive to a switching signal having a frequency of $f_c$ to alternately couple the time-share output signal to the first and second filters and thereby demodulate the signal modulated in quadrature to provide the first information signal through the first filter and the second information signal through the second filter.

7. A frequency converter for shifting the carrier frequency of an RF signal, the frequency converter comprising:

a time-share mixer circuit as in claim 1 that receives the RF signal as its input signal;

an in-phase filter;

a quadrature filter;

a first quadrature switching element that receives the time-share output signal and alternately provides said output signal to the in-phase and quadrature filters under control of a switching signal having a frequency of $f_c$;

an analog-to-digital converter;

a second switching signal source that provides a second switching signal;

a second quadrature switching element controlled by the second switching signal to alternately couple the in-phase and quadrature filters to the analog-to-digital converter; and a digital phase shifter, coupled to the analog-to-digital converter, that provides the desired frequency-shifted signal.

8. A frequency converter for shifting the carrier frequency of an RF signal, the frequency converter comprising:

a time-share mixer circuit as in claim 1 that receives the RF signal as its input signal;

an output phase shifter responsive to the switching signal to alternately shift the phase of the time-share output signal by first and second phase shifts, the second phase shift differing from the first by 90 degrees; and a bandpass filter that receives the phase-shifted time-share output signal and provides the desired frequency-shifted signal.

9. A time-share mixer circuit that receives an input signal and provides a time-share output signal, the time-share mixer circuit comprising:

a mixer having a primary input port, an oscillator input port, and an output port;

a local oscillator that provides an oscillator signal;

a switching signal source that provides a switching signal;

alternating signal means responsive to the switching signal to cause the time-share output signal to alternate between an in-phase output signal and a quadrature-phase output signal, the in-phase output signal being that output signal which the mixer would provide if the input signal were applied to the primary input port and the oscillator signal were applied to the oscillator input port, the quadrature-phase output signal being that output signal which the mixer would provide if the input signal were provided to the primary input port and the oscillator signal were phase-shifted by 90 degrees and then applied to the oscillator input port; and a duty-cycle equalizer operative to equalize the in-phase duty cycle and the quadrature-phase duty cycle of the time-share output signal independently of the duty cycle of the switching signal.

10. A time-share mixer circuit as in claim 9 wherein the duty-cycle equalizer comprises a duty-cycle signal source that provides a duty-cycle control signal having a frequency that is an even multiple of the frequency of the switching signal and a duty-cycle circuit element responsive to the duty-cycle control signal to alternately enable the in-phase and quadrature-phase output signals for equal periods of time.

11. A time-share mixer circuit as in claim 9, wherein the input signal is applied to the primary input port, the oscillator signal is applied to the oscillator input port, and the alternating signal means is connected in series with the mixer output port to provide the time-share output signal.

12. A time-share mixer circuit as in claim 9, wherein the input signal is applied to the primary input port, the oscillator signal is applied to the oscillator input port through the alternating signal means, and the time-share output signal is provided at the mixer output port.

13. A time-share mixer circuit as in claim 9, wherein the input signal is applied to the primary input port through the alternating signal means, the oscillator signal is applied to the oscillator input port, and the time-share output signal is provided at the mixer output port.

14. A frequency converter for shifting the carrier frequency of an RF signal, the frequency converter comprising:

a time-share mixer circuit as in claim 9 that receives the RF signal as its input signal;

an output phase shifter responsive to the switching signal to alternately shift the phase of the time-share output signal by first and second phase shifts, the second phase shift differing from the first by 90 degrees; and a bandpass filter that receives the phase-shifted time-share output signal and provides the desired frequency-shifted signal.

15. An I-Q modulator comprising:

a time-share mixer circuit as in claim 9; and an I-Q switching element responsive to the switching signal to alternately couple first and second information signals to the input of the time-share mixer circuit and thereby provide an I-Q output signal modulated in quadrature with both information signals.

16. An I-Q demodulator comprising:

a time-share mixer circuit as in claim 9 that receives a signal modulated in quadrature with first and second information signals;

first and second filters; and an I-Q switching element responsive to the switching signal to alternately couple the time-share output signal to the first and second filters and thereby demodulate the signal modulated in quadrature to provide the first information signal through the first filter and the second information signal through the second filter.

17. A frequency converter for shifting the carrier frequency of an RF signal, the converter comprising:

a time-share mixer circuit as in claim 7, that receives the RF signal as its input signal;

an in-phase filter;

a quadrature filter;

a first quadrature switching element that receives the time-share output signal and alternately provides said output signal to the in-phase and quadrature filters under control of the switching signal;

an analog-to-digital converter;

a second switching signal source that provides a second switching signal;

a second quadrature switching element controlled by the second switching signal to alternately couple the in-phase and quadrature filters to the analog-to-digital converter; and a digital phase shifter, coupled to the analog-to-digital converter, that provides the desired frequency-shifted signal.

18. A frequency converter for shifting the carrier frequency of an RF signal, the frequency converter comprising;

a time-share mixer circuit that receives the RF signal as its input signal, the time-share mixer circuit including:

a mixer having an oscillator input port, an output port, and a primary input port, a local oscillator that provides an oscillator signal, a switching signal source that provides a switching signal, and alternating signal means responsive to the switching signal to cause the time-share output signal to alternate between an in-phase output signal and a quadrature-phase output signal, the in-phase output signal being that output signal which the mixer would provide if the input signal were applied to the primary input port and the oscillator signal were applied to the oscillator input port, the quadrature-phase output signal being that output signal which the mixer would provide if the input signal were provided to the primary input port and the oscillator signal were phase-shifted by 90 degrees and then applied to the oscillator input port;

an output phase shifter responsive to the switching signal to alternately shift the phase of the time-share output signal by first and second phase shifts, the second phase shift differing from the first by 90 degrees; and a bandpass filter that receives the phase-shifted time-share output signal and provides the desired frequency-shifted signal.

19. A frequency converter as in claim 18, wherein the output phase shifter comprises:

a filter having an input and an output, and including a resistor connected between the input and the output, a first shunt capacitor, a second shunt capacitor, and switching means responsive to the switching signal to alternately connect the first shunt capacitor and the second shunt capacitor to the output; and means for applying the time-share output signal across the filter.

20. A frequency converter as in claim 18, wherein:

the RF signal is applied to the primary input port of the mixer;

the time-share output signal is provided at the mixer output port; and the alternating signal means comprises:

a phase shifter that shifts the phase of the oscillator signal by 90 degrees to provide a phase-shifted oscillator signal, and a switching element responsive to the switching signal to alternately couple the oscillator signal and the phase-shifted oscillator signal to the oscillator port of the mixer.

21. A frequency converter as in claim 18, wherein:

the time-share output signal differs in frequency from the RF signal by a frequency difference;

the switching signal has a frequency;

the alternating signal means comprises a clocked inverter in series with a port of the mixer, the clocked inverter operating in response to a clock signal having a frequency of one half of the frequency of the switching signal; and the oscillator signal differs in frequency from the frequency difference by the frequency of the clock signal of the clocked inverter.

22. A frequency converter for shifting the carrier frequency of an RF signal, the frequency converter comprising:

a time-share mixer circuit that receives the RF signal as its input signal, the time-share mixer circuit including:

a mixer having an oscillator input port, an output port, and a primary input port, a local oscillator that provides an oscillator signal, a switching signal source that provides a switching signal;

alternating signal means responsive to the switching signal to cause the time-share output signal to alternate between an in-phase output signal and a quadrature-phase output signal, the in-phase output signal being that output signal which the mixer would provide if the input signal were applied to the primary input port and the oscillator signal were applied to the oscillator input port, the quadrature-phase output signal being that output signal which the mixer would provide if the input signal were provided to the primary input port and the oscillator signal were phase-shifted by 90 degrees and then applied to the oscillator input port;

a plurality of cascaded low-pass filter stages that filter the time-share output signal, each stage having a resistor, first and second capacitors, switching means responsive to the switching signal to alternately connect the first capacitor and the second capacitor in series with the resistor, and an output amplifier;

a sample-and-hold circuit that samples the filtered time-share output signal;

an analog-to-digital converter that converts the samples provided by the sample-and-hold circuit into a digital signal; and a digital phase shifter that alternately shifts the phase of the digital signal by first and second phase shifts, the second phase shift differing from the first by 90 degrees, and thereby provides the desired frequency-shifted signal.

23. A frequency converter as in claim 22, wherein:

the RF signal is applied to the primary input port of the mixer;

the time-share output signal is provided at the mixer output port; and the alternating signal means comprises:

a phase shifter that shifts the phase of the oscillator signal by 90 degrees to provide a phase-shifted oscillator signal; and a switching element responsive to the switching signal to alternately couple the oscillator signal and the phase-shifted oscillator signal to the oscillator port of the mixer.

24. A frequency converter as in claim 22, wherein:

the time-share output signal differs in frequency from the RF signal by a frequency difference;

the switching signal has a frequency;

the alternating signal means comprises a clocked inverter in series with a port of the mixer, the clocked inverter operating in response to a clock signal having a frequency of one half of the frequency of the switching signal; and the oscillator signal differs in frequency from the difference frequency by the frequency of the clock signal of the clocked inverter.

25. A frequency converter as in claim 22, additionally comprising a duty-cycle equalizer operative to equalize the in-phase output signal duty cycle with the quadrature-phase output signal duty cycle.

26. A frequency converter for shifting the carrier frequency of an RF signal, the frequency converter comprising:
- a time-share mixer circuit connected to receive the RF signal as its input signal and generating a time-share output signal, the time-share mixer circuit including:
  - a first mixer having an oscillator input port, an output port, and a primary input port,
  - a local oscillator that provides an oscillator signal;
  - a switching signal source that provides a first switching signal;
  - alternating signal means responsive to the switching signal to cause the time-share output signal to alternate between an in-phase output signal and a quadrature-phase output signal, the in-phase output signal being that output signal which the first mixer would provide if the input signal were applied to the primary input port and the oscillator signal were applied to the oscillator input port, the quadrature-phase output signal being that output signal which the first mixer would provide if the input signal were applied to the primary input port and the oscillator signal were phase shifted by 90 degrees and then applied to the oscillator input port;
- a filter that filters the time-share output signal from the time-share mixer circuit;
- a second mixer having a primary input port that receives the filtered signal from the filter, an oscillator input port, and an output port;
- a second local oscillator that provides a second oscillator signal; and
- second alternating signal means responsive to a second switching signal to cause an output signal provided at the second mixer output port to alternate between first and second output signals, the first output signal being that output signal which the second mixer would provide if the second oscillator signal were applied to the second mixer oscillator input port, the quadrature-phase output signal being that output signal which the second mixer would provide if the second oscillator signal were phase-shifted by 90 degrees and then applied to the second mixer oscillator input port.

27. A frequency converter as in claim 26, wherein:
- in the time-share mixer circuit, the RF signal is applied to the primary input port, and the first output signal is provided at the mixer output port; and
- at least one of the first alternating signal means and the second alternating signal means comprises:
  - a phase shifter that shifts the phase of the respective one of the first oscillator signal and the second oscillator signal by 90 degrees to provide a respective one of a phase-shifted first oscillator signal and a phase-shifted second oscillator signal, and
  - a switching element, responsive to the respective one of the first switching signal and the second switching signal, to couple the respective one of:
    - the first oscillator signal and the phase-shifted first oscillator signal alternately to the oscillator port of the first mixer; and
    - the second oscillator signal and the phase-shifted second oscillator signal alternately to the oscillator port of second mixer.

28. A frequency converter as in claim 26, wherein:
- the RF signal and the time-share output signal differ in frequency by a first frequency difference;
- the filtered signal and the output signal provided at the second mixer output port differ in frequency by a second frequency difference;
- the first switching signal and the second switching signal each have a frequency;
- at least one of the first alternating signal means and the second alternating signal means comprises a clocked inverter in series with a port of the respective one of the first mixer and the second mixer, the clocked inverter operating in response to a clock signal having a frequency of one half of the frequency of the respective one of the first switching signal and the second switching signal; and
- the respective one of the first oscillator signal and the second oscillator signal differs in frequency from the respective one of the first difference frequency and the second difference frequency by the frequency of the clock signal of the clocked inverter.

29. A frequency converter as in claim 26, additionally comprising a duty-cycle equalizer operative to equalize the in-phase output signal duty cycle with the quadrature-phase output signal duty cycle.

* * * * *